(12) United States Patent
Kiguchi et al.

(10) Patent No.: US 6,998,208 B2
(45) Date of Patent: *Feb. 14, 2006

(54) SYSTEM AND METHODS FOR PRODUCING A COLOR FILTER

(75) Inventors: Hiroshi Kiguchi, Nagano-ken (JP); Satoru Katagami, Hara-mura (JP); Tatsuya Ito, Matsumoto (JP); Hisashi Aruga, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 10/875,814

(22) Filed: Jun. 25, 2004

(65) Prior Publication Data
US 2004/0259006 A1   Dec. 23, 2004

Related U.S. Application Data

(62) Division of application No. 10/175,070, filed on Jun. 20, 2002, now Pat. No. 6,830,855.

(30) Foreign Application Priority Data

| Jun. 25, 2001 | (JP) | ............................ 2001-191562 |
| May 31, 2002 | (JP) | ............................ 2002-159665 |

(51) Int. Cl.
G02B 5/20 (2006.01)
G02F 1/13 (2006.01)
(52) U.S. Cl. ........................... 430/7; 347/106; 347/107
(58) Field of Classification Search .................... 430/7, 430/321; 349/106; 347/106, 107; 359/891
See application file for complete search history.

(56) References Cited

U.S. PATENT DOCUMENTS

| 6,143,450 A |   | 11/2000 | Sobue et al. |
| 6,830,855 B1 | * | 12/2004 | Kiguchi et al. ................ 430/7 |

FOREIGN PATENT DOCUMENTS

| EP | 0 862156 A1 | 9/1998 |
| EP | 1 074 862 A1 | 2/2001 |
| JP | 59-75205 | 4/1984 |
| JP | A 10-186123 | 7/1998 |
| JP | A 2001-66408 | 3/2001 |
| JP | A 2001-147316 | 5/2001 |
| WO | WO 98/12689 | 3/1998 |

* cited by examiner

Primary Examiner—John A. McPherson
(74) Attorney, Agent, or Firm—Oliff & Berridge, PLC

(57) ABSTRACT

The invention provides a color filter which includes a light shielding region having sufficient light shielding performance, and a transmitting region having no color mixing, and which has high contrast without pixel defect and irregularity in color tone. A color filter of the present invention can include a pixel region and a spotting precision test region. The pixel region includes a light shielding region and a transmitting region partitioned by the light shielding region. The light shielding region includes a first light shielding layer. The transmitting region includes a color element. The spotting precision test region is positioned apart from the pixel region and includes a second light shielding layer and a spotting precision test layer provided to cover at least the second light shielding layer. The spotting precision test layer region includes an evaluation region partitioned by the second light shielding layer.

1 Claim, 21 Drawing Sheets

FIG. 3
(A)
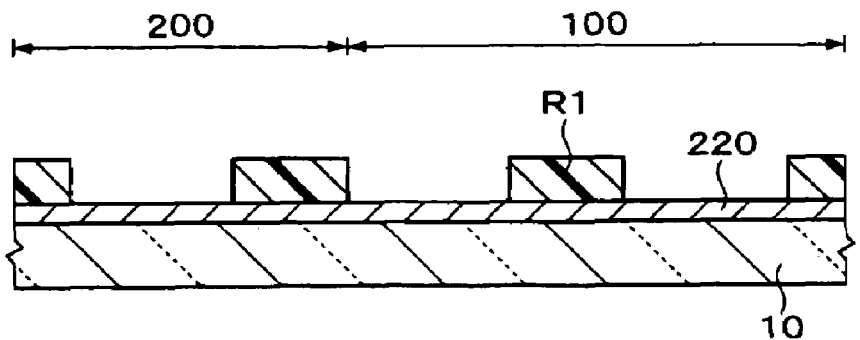
(B)
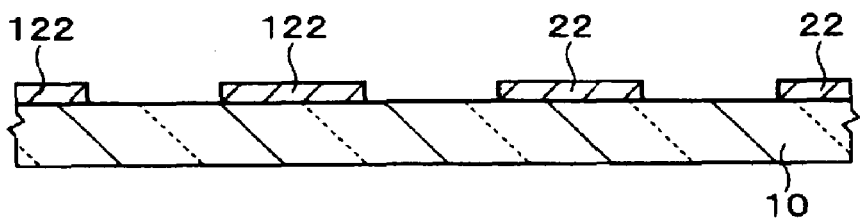
(C)
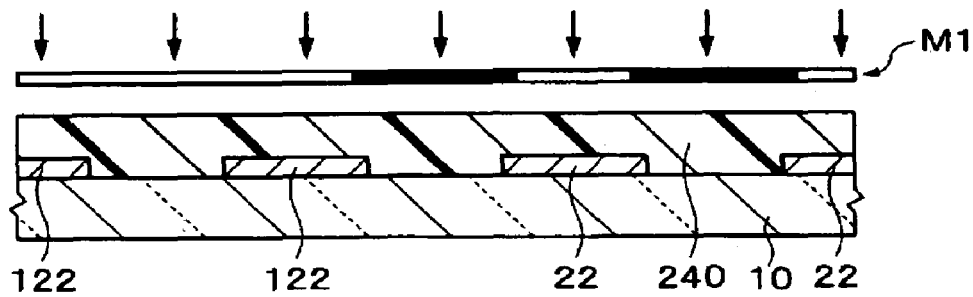
(D)
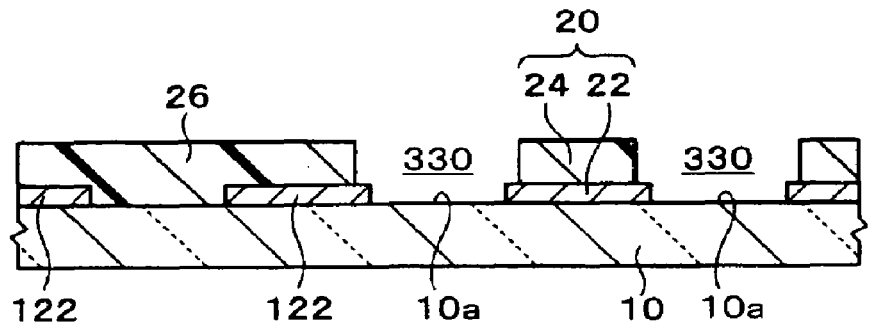

FIG. 4
(A)
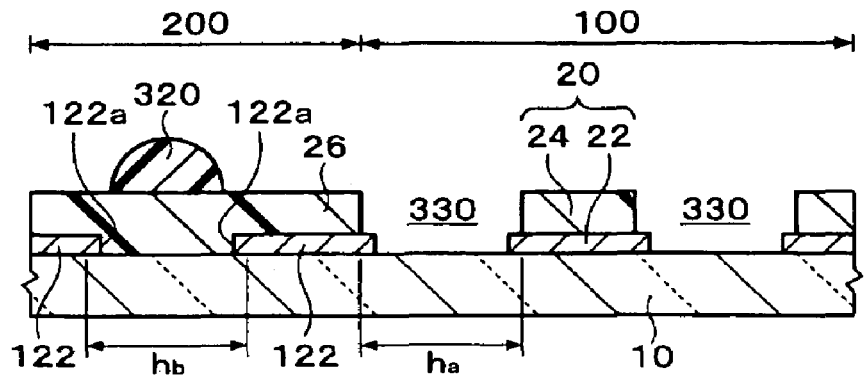
(B)
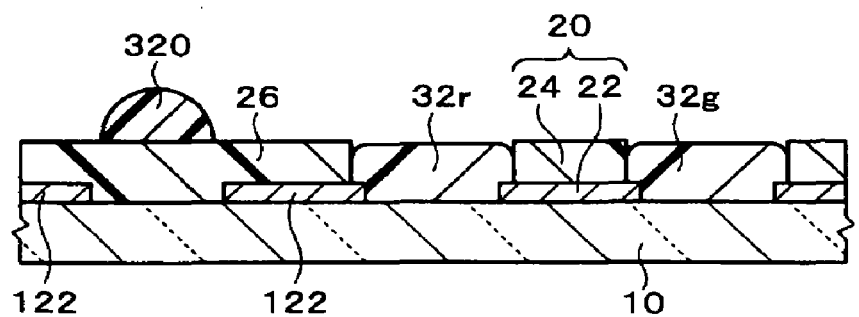
(C)
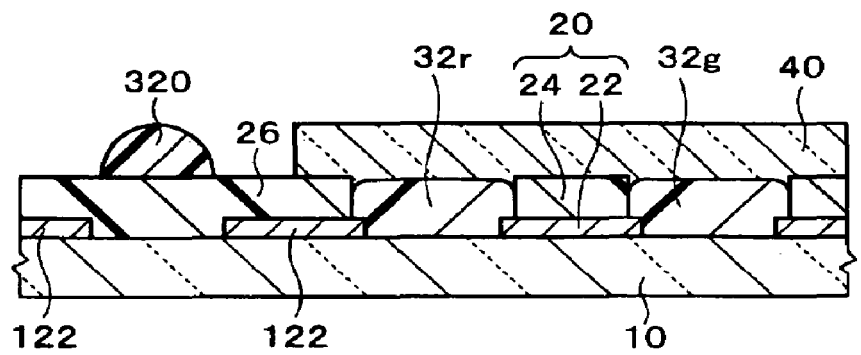
(D)
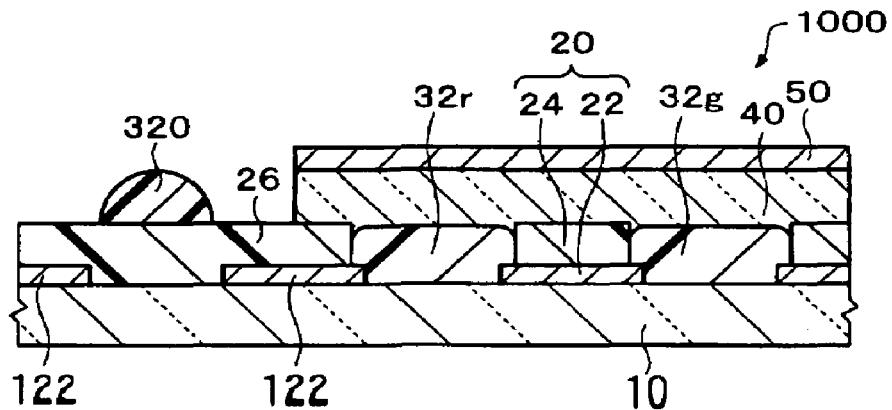

FIG. 8
(A)
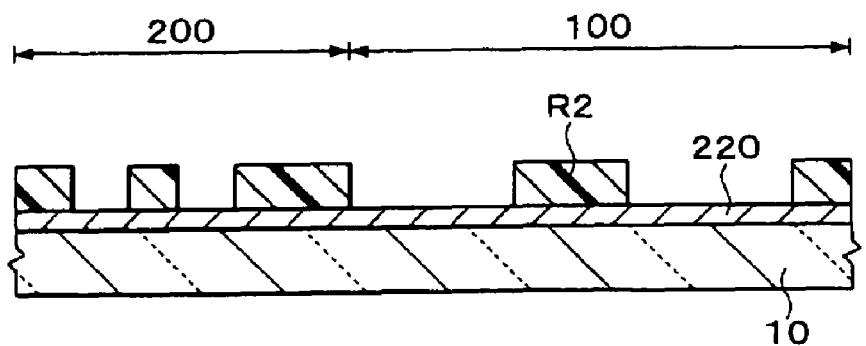
(B)
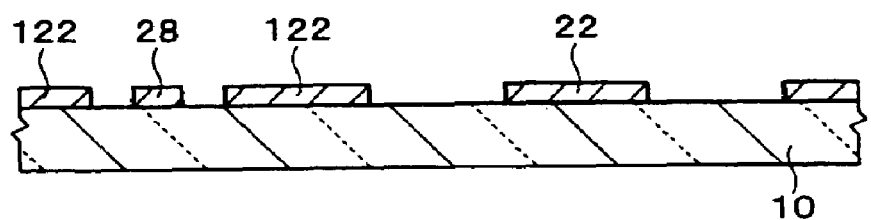
(C)
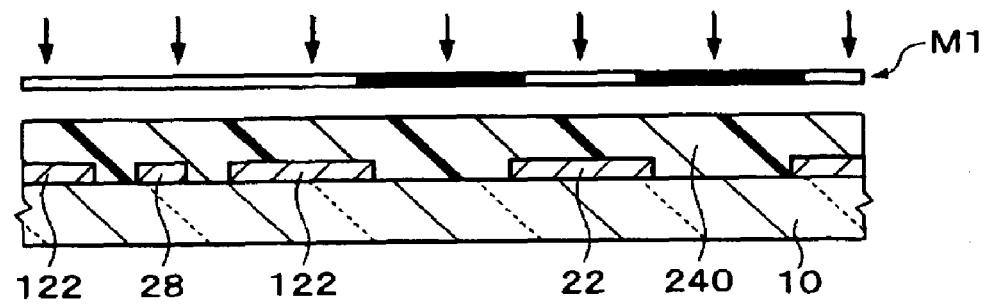
(D)
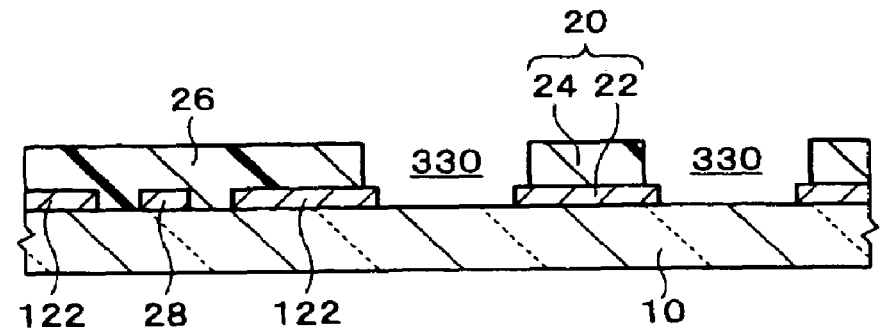

FIG. 9
(A)
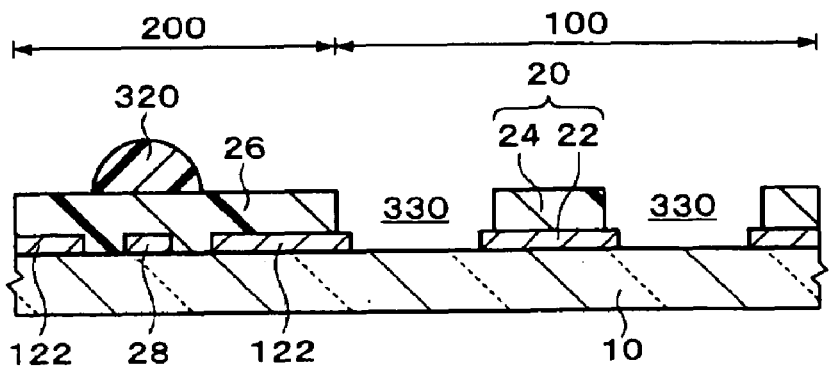
(B)
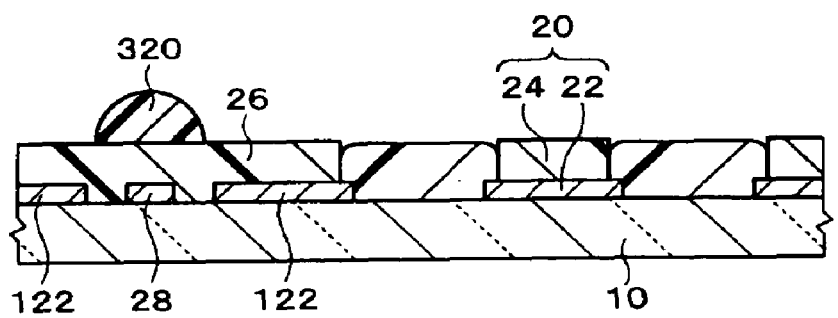
(C)
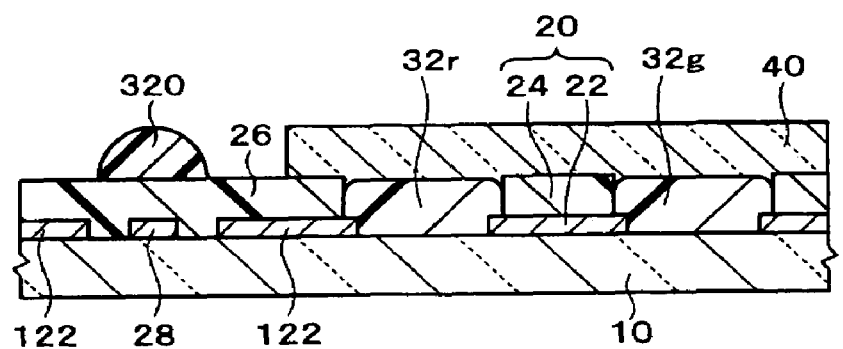
(D)
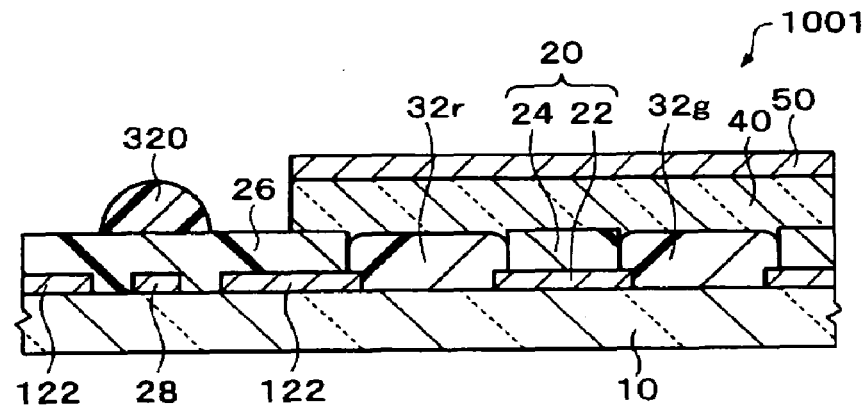

FIG. 17
(A)
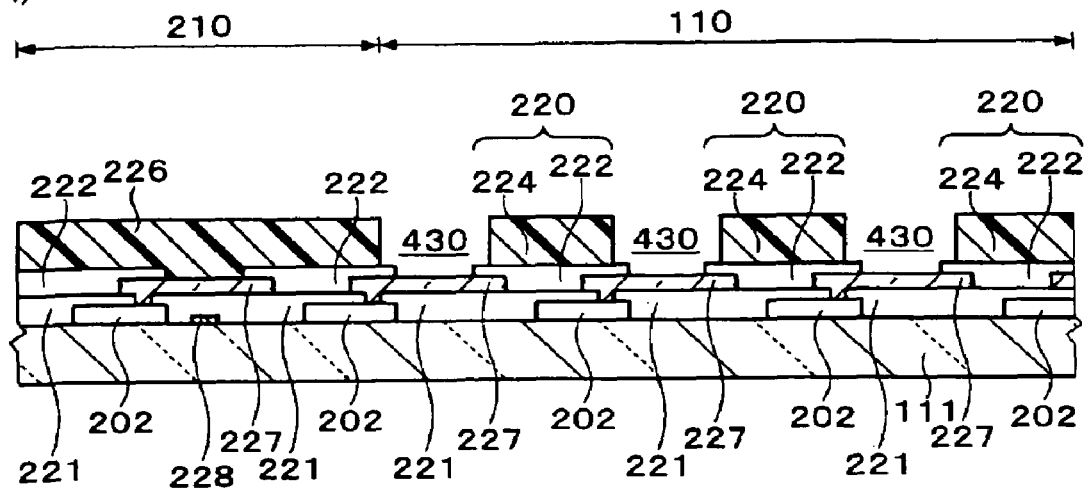
(B)
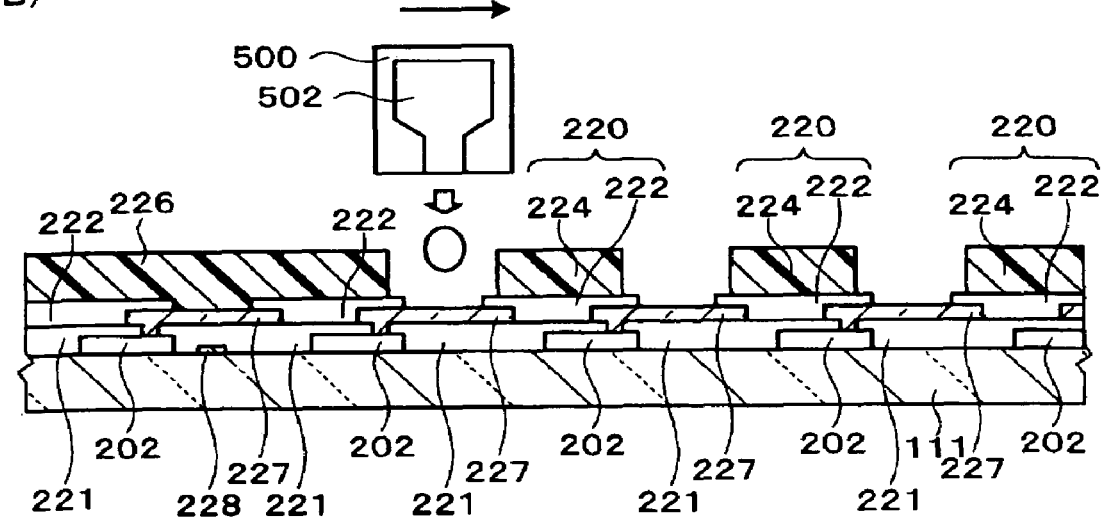
(C)
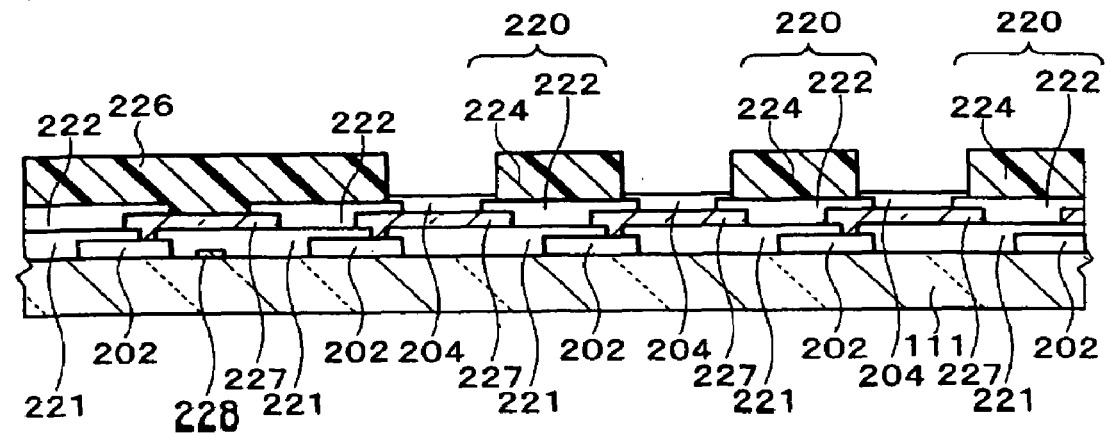

FIG. 19
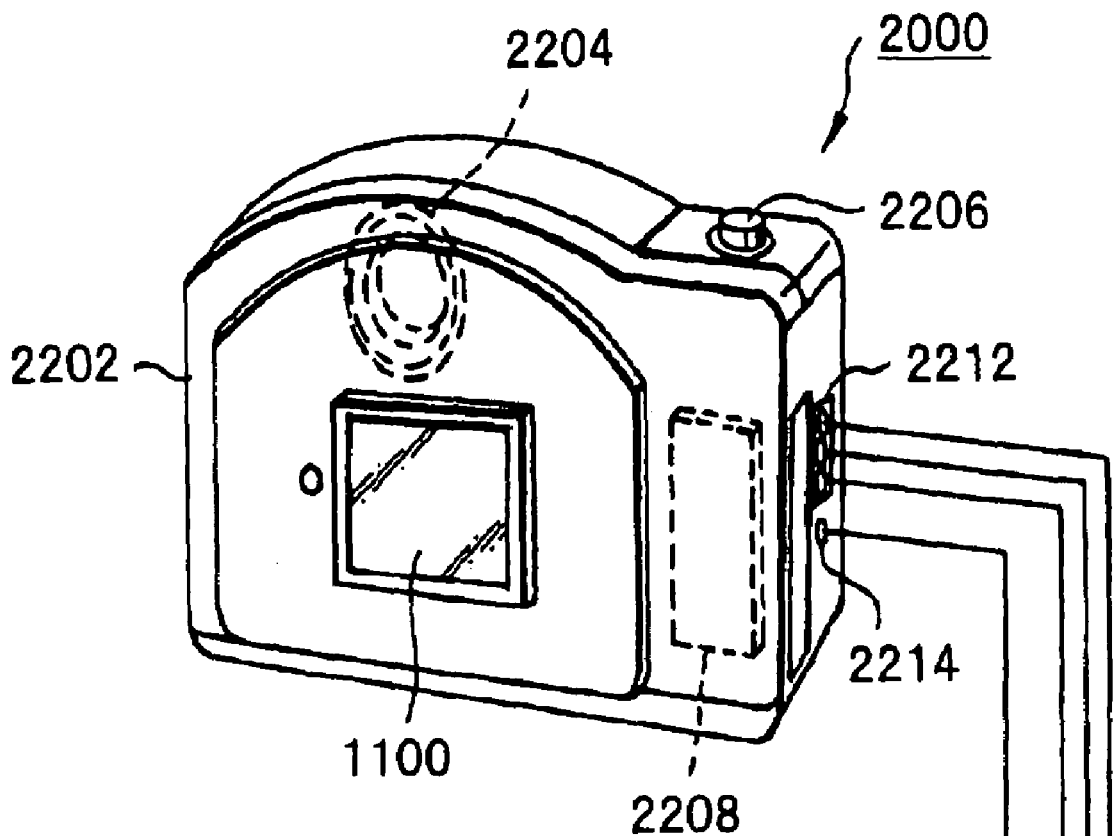
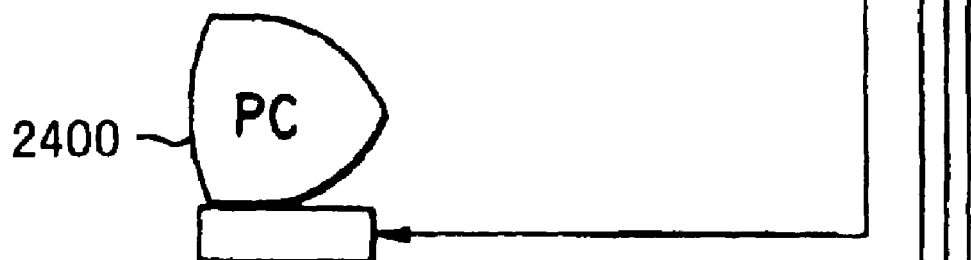
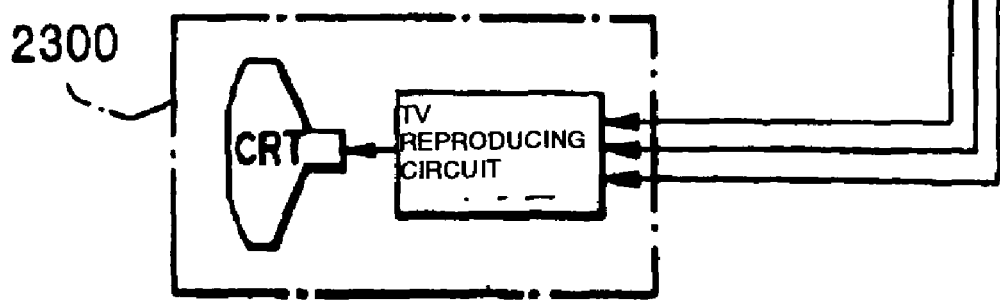

FIG. 20
(A)
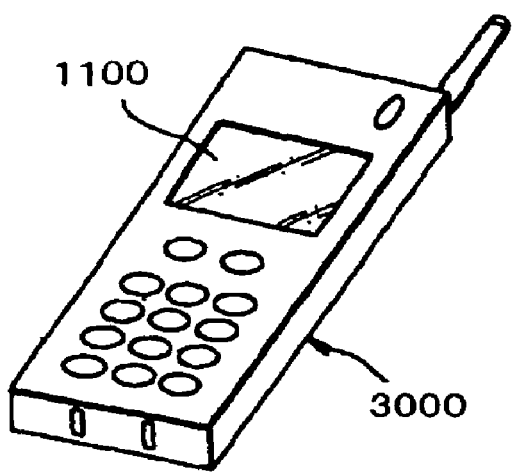
(B)
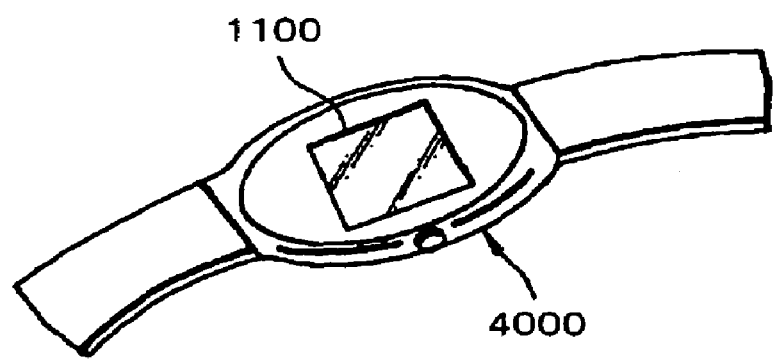
(C)
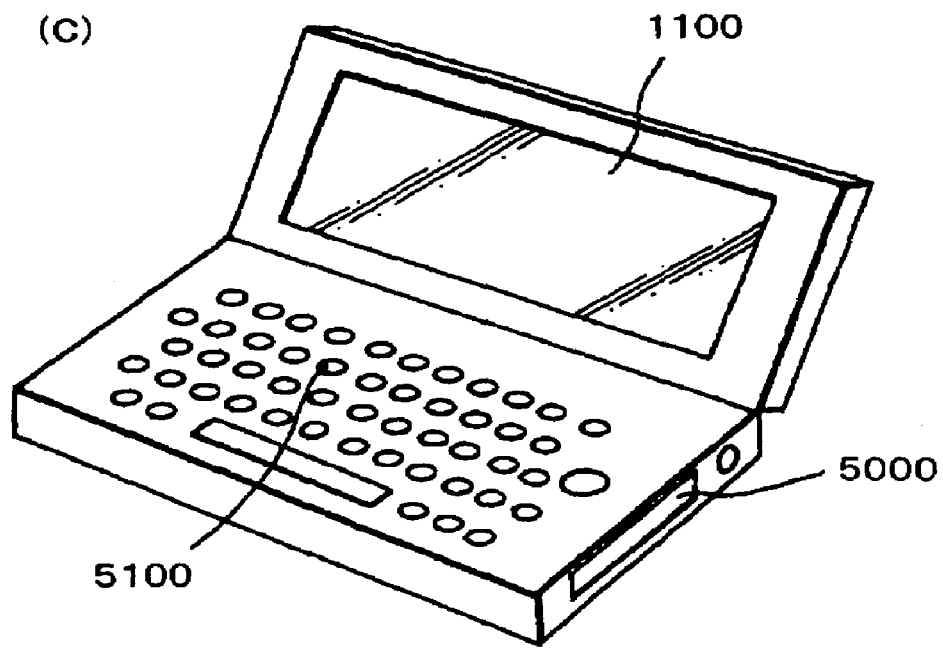

SYSTEM AND METHODS FOR PRODUCING A COLOR FILTER

This is a Division of application Ser. No. 10/175,070 filed Jun. 20, 2002, now U.S. Pat. No. 6,830,855. The entire disclosure of the prior application is hereby incorporated by reference herein in its entirety.

BACKGROUND OF THE INVENTION

1. Field of Invention

The present invention relates to a color filter and a method of producing the same, a droplet spotting precision test substrate for a color filter and a method of producing the substrate, a light emission substrate and a method of producing the same, a droplet potting precision test substrate for a light emission substrate and a method of producing the substrate, an electrooptic device and electronic apparatus each including the color filter or the light emission substrate, and a film deposition method and apparatus.

2. Description of Related Art

In recent years, demands for liquid crystal displays have increased with progress in personal computers, particularly portable personal computers. Accordingly, there is an urgent need to establish a high quality display at a reasonable cost. From the viewpoint of environmental protection, it has recently been required to convert to an improved process capable of decreasing environmental loading.

Currently, as a conventional method of producing a color filter, the following method is known. In this method, a chromium thin film as a light shielding material is first patterned by photolithography and etching to form a black matrix. Then, apertures of the black matrix are coated with photosensitive resins of red, green and blue by spin coating for each color, and then patterned by photolithography. As a result, a color matrix can be formed, in which colored layers (dots) of red, green and blue are arranged adjacent to each other. In the production method, the photolithography step must be performed for each of the respective colors of read, green and blue, and the photosensitive material is lost due to removal of an unnecessary portion during patterning of each color, resulting in a color filter having high environmental loading and high cost.

SUMMARY OF THE INVENTION

As a method for resolving the problem of the production method, for example, Japanese Unexamined Patent Application Publication No. 59-75205 proposes a method using an ink jet process. In this method, a material having low wettability with ink is deposited in a matrix to form a partition for dividing a colored layer formation region, and then the regions within the partition are coated with a non-photosensitive color material by the ink jet process to form the colored layers. This production method can decrease complexity of the photolithography process, and further decrease the loss of the color material. Therefore, there have been many proposals of color filter producing methods each including the step of coating the non-photosensitive color material by a droplet discharge method such as the ink jet process or the like.

An object of the present invention is to provide a color filter and a light emission substrate each of which is formed by discharging a droplet material. The invention can include a light shielding region with sufficient light shielding performance and a transmitting region without color mixing, and exhibits high contrast without a pixel defect and irregularity in color tone.

Another object of the present invention is to provide a method of producing a color filter and a method of producing a light emission substrate, which are capable of precisely applying a color material to a predetermined region by discharging a droplet material.

A further object of the present invention is to provide a droplet material spotting precision test substrate for a color filter and a method of producing the substrate, and a droplet material spotting precision test substrate for a light emission substrate and a method of producing the substrate, both of which are used for precisely applying a coloring material to a predetermined region by discharging a droplet material.

A still further object of the present invention is to provide a method of measuring droplet material spotting precision by using the color filter, the light emission substrate or the droplet material spotting precision test substrate for the color filter or the light emission substrate.

A further object of the present invention is to provide an electrooptic device and an electronic apparatus each including the color filer or the light emission substrate.

A further object of the present invention is to provide a film deposition method and a film deposition apparatus each using a droplet material.

The color filter and method of measuring spotting precision of a droplet material of the present invention can include a pixel region having a light shielding region and a transmitting region partitioned by the light shielding region, and a spotting precision test region positioned apart from the pixel region. The invention can also include a first light shielding layer provided in the light shielding region, a color element provided in the transmitting region, a second light shielding layer provided in the spotting precision test region, and a spotting precision test layer provided in the spotting precision test region so as to cover at least the second light shielding layer. An evaluation region partitioned by the second light shielding layer can be provided in the spotting precision test region.

In the color filter of the present invention, the pixel region can mean a region including pixels used for the color filter. The spotting precision test region can mean a region of the color filter, in which the pixels are not formed, or a region including pixels not used for as pixels for the color filter. The evaluation region can mean a region serving as an evaluation object of spotting precision of a droplet material in a spotting precision test of the droplet material.

The color filter of the present invention can include the evaluation region provided in the spotting precision test region, and thus the spotting precision test of the droplet material can be performed on the spotting precision test layer, thereby permitting the droplet material to be precisely applied to a predetermined region in the pixel region. Therefore, the color filter of the present invention has sufficient light shielding performance in the light shielding region, and causes no color mixing in the transmitting region, thereby causing neither pixel defect nor irregularity in color tone, and high contrast. This color filter is described in detail in "Description of Embodiments" below.

The invention can also include a color filter including a pixel region having a light shielding region and a transmitting region surrounded by the light shielding region, a color element formed in the transmitting region by discharging a droplet material, and a peripheral region arranged adjacent to the pixel region and having a light shielding region. The invention can further include an evaluation region included in the peripheral region and surrounded by the light shielding region of the peripheral region to have a shape corresponding to the shape of the transmitting region.

The color filter of the present invention includes the evaluation region, and thus the spotting precision test of the droplet material can be performed on the evaluation region, thereby permitting the droplet material to be precisely applied to a predetermined region in the pixel region. Therefore, the color filter of the present invention has sufficient light shielding performance in the light shielding region, and causes no color mixing in the transmitting region, thereby causing neither pixel defect nor irregularity in color tone, and high contrast.

The present invention can include a color filter having a pixel region having a light shielding region and a transmitting region surrounded by the light shielding region, a color element formed in the transmitting region by discharging a droplet material, a peripheral region arranged adjacent to the pixel region and having a light shielding region, an evaluation region included in the peripheral region and surrounded by the light shielding region of the peripheral region, and a layer having the property of repelling the droplet material and provided in the peripheral region so as to cover the region surrounded by the evaluation region.

The color filter of the present invention includes the layer provided in the peripheral region to cover the evaluation region and having the property of repelling the droplet material, and thus the spotting precision test of the droplet material can be performed on the layer, thereby permitting the droplet material to be precisely applied to a predetermined region in the pixel region. Therefore, the color filter of the present invention has sufficient light shielding performance in the light shielding region, and causes no color mixing in the transmitting region, thereby causing neither pixel defect nor irregularity in color tone, and high contrast.

The present invention can also include a color filter having a pixel region having a light shielding region and a plurality of transmitting regions surrounded by the light shielding region, a color element formed in each of the transmitting regions by discharging a droplet material, a peripheral region arranged adjacent to the pixel region and having a light shielding region, and an evaluation region included in the peripheral region and surrounded by the light shielding region of the peripheral region. The plurality of transmitting regions and the evaluation region are arrayed.

The color filter of the present invention can include the plurality of transmitting regions and the evaluation region, which are arrayed, and thus the spotting precision test of the droplet material can be performed on the evaluation region, thereby permitting the droplet material to be precisely applied to a predetermined region in the pixel region. Therefore, the color filter of the present invention has sufficient light shielding performance in the light shielding region, and causes no color mixing in the transmitting region, thereby causing neither pixel defect nor irregularity in color tone, and high contrast.

By using the color filter of the present invention, the spotting precision of the droplet material can be measured in the spotting precision test region by forming a convex layer by spotting the droplet material on the spotting precision test layer. In this measurement method, the convex layer is formed on the spotting precision test layer provided in the spotting precision test region of the color filter of the present invention.

The color filter of the present invention may have any of the following forms. For example, the light shielding region constituting the pixel region can further include a bank layer which can be provided on the first light shielding layer provided in the pixel region. In this construction, the bank layer is provided on the first light shielding layer provided in the pixel region, and thus the light shielding function and the function to divide the color element can be independently provided, thereby securely exhibiting both functions. As a result, the color filter of the present invention produces less pixel defect due to insufficient light fielding performance and color mixing. Furthermore, by dividing these functions, materials suitable for forming the first light shielding layer and the bank layer provided in the pixel region can be selected from a wide range, causing an advantage from the viewpoint of production cost. Particularly, when the first light shielding layer can include a metal layer, uniform and sufficient light shielding performance can be obtained by a thin layer.

Additionally, the second light shielding layer provided in the spotting precision test region may have the same pattern as the first light shielding layer provided in the pixel region. In this construction, when the spotting precision test of the droplet material is performed for the spotting precision test layer of the color filter of the present invention, the spotting precision of the droplet material can be evaluated on the assumption that the droplet material is spotted in a region of the pixel region in which the color element is formed.

Further, a vernier layer can be provided in the spotting precision test region. In this construction, when the spotting precision test of the droplet material is performed for the spotting precision test layer, a deviation of a spot position of the droplet material can be determined by a relative position between the droplet material layer formed on the spotting precision test layer and the vernier layer. In this case, the vernier layer can be provided at a predetermined position in the evaluation region. Also, in this case, the vernier layer can also be formed by using the same material as the second light shielding layer.

A droplet material spotting precision test substrate for a color filter of the present invention can include a spotting precision test region including a light shielding layer and a spotting precision test layer formed to at least cover the light shielding layer, wherein an evaluation region partitioned by the light shielding layer is provided in the spotting precision test region.

In the present invention, the spotting precision test of the droplet material can be performed for the spotting precision test substrate for the color filter of the present invention before the color filter is produced, and thus the color element of the color filter to be actually produced can be formed after the spotting precision of the droplet material is sufficiently confirmed and then improved. Therefore, in producing the color filter, the droplet material can be precisely applied to the predetermined region to produce the color filter exhibiting sufficient light shielding performance in the light shielding region and no color mixing in the transmitting region, and high contrast without a pixel defect and irregularity of color tone.

By using the droplet material spotting precision test substrate for the color filter of the present invention, the spotting precision of the droplet material is measured in the spotting precision test region by forming a convex layer by spotting the droplet material on the spotting precision test layer. In this measurement method, the convex layer is formed on the spotting precision test layer in the droplet material spotting precision test substrate for the color filter of the present invention.

Furthermore, a vernier layer can be provided in the droplet material spotting precision test substrate for the color filter of the present invention. In this case, the vernier layer can be provided at a predetermined position in the evaluation region. Additionally, in this case, the vernier layer can also be formed by using the same material as the light shielding layer. This construction has the same function and effect as the color filter of the present invention.

The present invention includes a method of producing a color filter of the present invention including the steps of forming a first light shielding layer having a predetermined matrix pattern in a pixel region to provide a light shielding region including the first light shielding layer, forming a second light shielding layer having a predetermined pattern in a spotting precision test region positioned apart from the pixel region to form an evaluation region partitioned by the second light shielding layer, the step of forming a spotting precision test layer to cover at least the second light shielding layer in the spotting precision test region, and the step of forming a color element in a color element formation region in the pixel region to form a transmitting region partitioned by the light shielding region.

In the specification, the color element formation region can mean a region of the pixel region in which the color element is formed. Specifically, the color element formation region can mean a region of the pixel region, which is partitioned by the light shielding region in the pixel region. The light shielding region mainly includes the first light shielding layer, and a bank layer (described below) according to demand.

The method of producing the color filter of the present invention can produce the color filter having neither pixel defect nor irregularity in color tone, and high contrast by a simple process.

The method of producing the color filter of the present invention may use any of the following modes. For example, the step of forming the spotting precision test layer in the spotting precision test region and forming a bank layer on the first light shielding layer in the pixel region. In this production method, a coloring material of each of the colors, for example, red, green and blue, can be applied to the color element formation region without causing color mixing, thereby obtaining the color filter having no defect such as irregularity in color tone, and high contrast.

Additionally, the method may further include the step of spotting the droplet material on the spotting precision test layer to form a convex layer in the spotting precision test region. In this production method, the color element actually used as a pixel can be formed by spotting the droplet material in the color element formation region in the pixel region after the spotting precision of the droplet material is evaluated by forming the convex droplet material layer on the spotting precision test layer in the spotting precision test region. Therefore, the color element can be precisely applied to the predetermined region, and thus the color filter exhibiting sufficient light shielding performance in the pixel region and no color mixing in the light shielding region, and having neither pixel defect nor irregularity in color tone, and high contrast can be produced by a simple process.

Further, each of the first and second light shielding layers can be formed by forming a metal layer on a substrate, and then patterning the metal layer by photolithography and etching. In this construction, by using a metal layer for each of the first and second light shielding layers, sufficient and uniform light shielding performance can be obtain by a thin layer. The metal layer can be formed by a vapor deposition method, a sputtering method, a chemical vapor deposition method, or the like.

The step of forming the first light shielding layer can include the step of forming the second light shielding layer in the spotting precision test region, and forming a vernier layer at a predetermined position in the evaluation region.

The step of forming the spotting precision layer can include the step of forming a photosensitive region layer on the first light shielding layer in the pixel region, and then pattering the photosensitive resin layer by photolithography to form the bank layer. The bank layer is not required to have light shielding performance, and thus need not be black. Thus, the bank layer can be selected from a wide range of a generally available photosensitive resin compositions.

The step of forming a color element can include the step of applying the droplet material to the color element formation region by using a droplet material discharge head to from the color element. This method can form the color filter of the present invention by a small number of simple steps. Namely, the color element is formed by applying the droplet material from the droplet material discharge head, and thus the step of patterning by photolithography can be removed to simplify the process. Since the droplet material is deposited to the color element formation region by using the droplet material discharge head, the droplet material can be applied only to a necessary region. Unlike patterning by photolithography, the coloring material is not lost by removing an unnecessary potion, and the cost of the color filter can be decreased. In the present invention, the droplet material can be applied as droplets of 6 to 30 pico-liters. By controlling the number of such droplets, a desired amount of droplet material can be precisely applied to a fine region of, for example, a 40- to 100-$\mu$m square.

The present invention can include a method of producing a droplet material spotting precision test substrate for a color filter of the present invention including the steps of forming a light shielding layer having a predetermined matrix pattern to form an evaluation region partitioned by the light shielding layer, and forming a spotting precision test layer to cover at least the light shielding layer to form a spotting precision test region.

The method of producing the droplet material spotting precision test substrate for the color filter of the present invention has substantially the same function and effect as the method of producing the color filter of the present invention.

The method of producing the droplet material spotting precision test substrate for the color filter of the present invention may have any of the following forms. For example, the method may further include the step of spotting the droplet material on the spotting precision test layer in the spotting precision test region to form a convex layer.

In the step of forming the light shielding layer, the light shielding layer can be formed by forming a metal layer on a substrate, and then patterning the metal layer by photolithography and etching. Also the step can include the step of forming the light shielding layer and forming a vernier layer at a predetermined position in the evaluation region.

The production method described above has substantially the same function and effect as the method of producing the color filter of the present invention. When the method described above is performed before the color filter is actually produced, the color element of the color filter to be actually produced can be formed after the spotting precision of the droplet material is sufficiently confirmed by using the droplet material spotting precision test substrate for the color filter and then improved. As a result, the droplet material can be precisely applied to the color element, producing the color filter having high contrast without a pixel defect and irregularity in color.

The present invention provides a light emission substrate of the present invention that can include a pixel region having a bank region and a light emission region partitioned by the bank region, a spotting precision test region positioned apart from the pixel region, a functional layer provided in the light emission region, and a spotting precision test layer provided in the spotting precision test region.

In the light emission substrate of the present invention, the pixel region can mean a region including pixels used for the light emission substrate. The spotting precision test region of the light emission substrate can mean a region in which the pixels are not formed, or a region including pixels not used for as pixels for the light emission substrate. The functional layer can mean a layer including a luminescent layer, and a hole transport/injection layer according to demand.

The light emission substrate of the present invention can include the spotting precision test layer provided in the spotting precision test region, and thus the spotting precision test of the droplet material can be performed on the spotting precision test layer, thereby permitting the droplet material to be precisely applied to a predetermined region in the pixel region. Therefore, the light emission substrate of the present invention has sufficient light shielding performance in the bank region, and causes no color mixing in the light emission region, thereby causing neither pixel defect nor irregularity in color tone, and high contrast. This light emission substrate is described in detail below.

The present invention can provide a light emission substrate of the present invention that includes a pixel region having a partition region and a light emission region surrounded by the partition region, a functional layer formed in the light emission region by discharging a droplet material, a peripheral region arranged adjacent to the pixel region, an evaluation region included in the peripheral region and having a shape corresponding to the shape of the light emission region, and a layer provided in the peripheral region to cover the evaluation region and having the property of expelling the droplet material.

In the light emission substrate of the present invention, the evaluation region can mean a region in which the spotting precision test of the droplet material is performed.

The light emission substrate of the present invention includes the layer provided in the peripheral region to cover the evaluation region and having the property of expelling the droplet material, and thus the spotting precision test of the droplet material can be performed on the layer, thereby permitting the droplet material to be precisely applied to a predetermined region in the pixel region. Therefore, the light emission substrate of the present invention has sufficient light shielding performance in the partition region, and causes no color mixing in the light emission region, thereby causing neither pixel defect nor irregularity in color tone, and high contrast.

The present invention can include a light emission substrate of the present invention that includes a pixel region having a partition region and a plurality of light emission regions surrounded by the partition region, a functional layer formed in the light emission regions by discharging a droplet material, a peripheral region arranged adjacent to the pixel region and having a light shielding region, and an evaluation region included in the peripheral region and having a shape corresponding to the shape of the light emission regions. The plurality of light emission regions and the evaluation region are arrayed.

The light emission substrate of the present invention can include the evaluation region and the plurality of transmitting region, which are arrayed, and thus the spotting precision test of the droplet material can be performed on the evaluation region, thereby permitting the droplet material to be precisely applied to a predetermined region in the pixel region. Therefore, the light emission substrate of the present invention has sufficient light shielding performance in the partition region, and causes no color mixing in the light emission region, thereby causing neither pixel defect nor irregularity in color tone, and high contrast.

By using the light emission substrate of the present invention, the spotting precision of the droplet material is measured in the spotting precision test region by forming a convex layer by spotting the droplet material on the spotting precision test layer. In this measurement method, the convex layer is formed on the spotting precision test layer provided in the spotting precision test region of the light emission substrate of the present invention.

The light emission substrate of the present invention may have any of the following forms. For example, the functional layer can be formed between a pair of electrodes. Additionally, the bank region can be formed by laminating in turn a first insulating layer and a resin layer.

In this case, the spotting precision test region includes a second insulating layer, and the second insulating layer constituting the spotting precision test region is formed at the same height from a substrate as the first insulating layer constituting the bank, and has the same pattern as the first insulating layer.

Additionally, each of the pixel region and the spotting precision test region includes a switching element, and the switching element formed in the spotting precision test region has the same structure as the switching element formed in the pixel region.

A vernier layer can be provided in the spotting precision test region. In this case, the switching element formed in the pixel region includes a metal wiring layer, and the vernier layer can be provided at the same height from the substrate as the metal wiring layer.

A convex layer can be formed on the spotting precision test layer provided in the spotting precision test region.

The above forms have substantially the same function and effect as the color filter of the present invention.

A droplet material spotting precision test substrate for a light emission substrate of the present invention including a switching element formed on a substrate, an electrode layer connected to the switching element, a bank insulating layer having a predetermined pattern, and a spotting precision test layer formed on the electrode layer.

The droplet material spotting precision test substrate for the light emission substrate of the present invention has substantially the same function and effect as the droplet material spotting precision test substrate for the color filter of the present invention.

By using the droplet material spotting precision test substrate for the light emission substrate of the present invention, the spotting precision of the droplet material is measured by forming a convex layer by spotting the droplet material on the spotting precision test layer. In this measurement method, the convex layer is formed on the spotting precision test layer of the droplet material spotting precision test substrate for the light emission substrate of the present invention.

Furthermore, a vernier layer can be provided on the droplet material spotting precision test substrate for the light emission substrate of the present invention.

In this case, the vernier layer can be made of a metal layer. This construction has substantially the same function and effect as the droplet material spotting precision test substrate for the color filter of the present invention.

The invention can provide a method of producing a light emission substrate including the steps of forming a bank region having a predetermined matrix pattern in a pixel region, forming a spotting precision test layer in a spotting precision test region positioned apart from the pixel region, and forming a functional layer in a region partitioned by the bank region in the pixel region to form a light emission region partitioned by the bank region.

The method of producing the light emission substrate of the present invention can produce the light emission substrate having neither pixel defect nor irregularity in color tone, and high contrast by a simple process.

The method of producing the light emission substrate of the present invention may have any of the following forms. For example, the method may further comprise the step of forming a pair of electrode layers for applying a charge to the functional layer in the pixel region.

In the step of forming a bank region, the bank region can be formed by laminating a resin layer on a first insulating layer. In this case, the step includes the step of forming the first insulating layer in the pixel region and forming a second insulating layer in the spotting precision test region. The first insulating layer and the second insulating layer can be formed at the same height from the substrate and formed in the same pattern.

In this case, in the step of forming a bank region, the resin layer can be formed by forming a photosensitive resin layer in the pixel region and then patterning the photosensitive resin layer by photolithography.

In this case, the step of forming a bank region of forming the resin layer and the step of forming the spotting precision test layer can be performed in the same step.

The method may further include the step of forming switching elements having the same structure in the pixel region and the spotting precision test region.

The method may further include the step of spotting droplets containing the droplet material on the spotting precision test layer to form a convex layer in the spotting precision test region.

The step of forming the bank region may include the step of forming the vernier layer in the spotting precision test region of the substrate.

In this case, in the step of forming switching elements, the switching element provided in the pixel region includes a metal wiring layer, and the vernier layer can be formed at the same height from the substrate as the metal wiring layer.

The step of forming a functional layer may include the step of applying the droplet material to a region partitioned by the bank region by using a droplet material discharge head to form the functional layer.

The above forms have substantially the same function and effect as the method of producing the color filter of the present invention.

The present invention can include a method of producing a droplet material spotting precision test substrate for a light emission substrate of the present invention can include the step of forming a switching element, an electrode layer, and a bank insulating layer having a predetermined pattern on a substrate, and forming a spotting precision test layer on the electrode layer.

The method of producing the droplet material spotting precision test substrate for the light emission substrate of the present invention has substantially the same function and effect as the method of producing the droplet material spotting precision test substrate for the color filter of the present invention.

The method of producing the droplet material spotting precision test substrate for the light emission substrate of the present invention may have any of the following modes. For example, the step of forming the spotting precision test can include the step of forming the spotting precision test layer on the electrode layer and the bank insulating layer.

The method may further include the step of spotting droplets containing the droplet material on the spotting precision test layer to form a convex layer.

The step of forming the spotting precision test can include the step of forming a photosensitive resin layer and then patterning the resin layer by photolithography to form the spotting precision test layer.

The step of forming the switching element can include the step of forming a vernier layer on the substrate.

The method described above has substantially the same function and effect as the method of producing the droplet material spotting precision test substrate for the color filter of the present invention.

The present invention provides an electrooptic device including the color filter of the present invention, a counter substrate disposed with a predetermined space between the color filter and the counter substrate, and an electrooptic material layer disposed between the color filter and the counter substrate.

In this case, by using a liquid crystal material layer as the electrooptic material layer, a liquid crystal display device having a high contrast without a pixel defect such as irregularity in color tone can be formed.

An electrooptic device of the present invention can include the light emission substrate of the present invention, wherein the functional layer constituting the light emission substrate can emit light by electroluminescence.

An electronic apparatus of the present invention can also include the above electrooptic device of the present invention.

In the electrooptic device and the electronic apparatus of the present invention, the function and effect of the color filter or the light emission substrate of the present invention are reflected, thereby achieving a display with high contrast without a pixel defect such as irregularity in color tone.

The present invention can provide a film deposition method of the present invention including forming a spotting precision confirmation pattern in a spotting precision test region positioned apart from a film formation region, forming a spotting precision test layer to cover at least the spotting precision confirmation pattern in the spotting precision test region, forming a convex layer by discharging a droplet material to a position on the spotting precision test layer, which corresponds to the spotting precision confirmation pattern, and evaluating spotting precision based on a relative position between the spotting precision confirmation pattern and the convex layer.

The film deposition method of the present invention including the step of evaluating spotting precision based on a relative position between the spotting precision confirmation pattern and the convex layer, and thus the spotting precision of the droplet material can be precisely evaluated. Therefore, film deposition can be made with high precision.

The present invention also includes a film deposition method of the present invention including the steps of forming a spotting precision confirmation pattern in a spotting precision test region positioned apart from a film formation region, forming a spotting precision test layer to cover at least the spotting precision confirmation pattern in the spotting precision test region, forming a plurality of convex layers by discharging a droplet material to a position on the spotting precision test layer, which corresponds to the spotting precision confirmation pattern, and evaluating spotting precision based on a relative position between the plurality of convex layers.

The film deposition method of the present invention includes the step of evaluating spotting precision based on a relative position between the plurality of convex layers, and thus the spotting precision of the droplet material can be precisely evaluated. Therefore, film deposition can be made with high precision.

In the above film deposition method, the spotting precision test layer can be formed to have the property of repelling the droplet material.

The present invention can include a film deposition apparatus of the present invention including a nozzle for discharging a droplet material.

A spotting precision confirmation pattern is formed in a spotting precision test region positioned apart from a film formation region, a spotting precision test layer is formed to cover at least the spotting precision confirmation pattern in the spotting precision test region, a convex layer is formed by discharging, from the nozzle, the droplet material to a position corresponding to the spotting precision confirmation pattern on the spotting precision test layer formed to cover at least the spotting precision confirmation pattern, and spotting precision is evaluated based on a relative position between the spotting precision confirmation pattern and the convex layer.

The film deposition apparatus of the present invention can evaluate spotting precision based on a relative position between the spotting precision confirmation pattern and the convex layer, and thus the spotting precision of the droplet material can be precisely evaluated. Therefore, film deposition can be made with high precision.

The present invention can also include a film deposition apparatus of the present invention having a nozzle for discharging a droplet material.

A spotting precision confirmation pattern is formed in a spotting precision test region positioned apart from a film formation region, a spotting precision test layer is formed to cover at least the spotting precision confirmation pattern in the spotting precision test region, a plurality of convex layers are formed by discharging, from the nozzle, a droplet material to a position corresponding to the spotting precision confirmation pattern on the spotting precision test layer formed to cover at least the spotting precision confirmation pattern, and spotting precision is evaluated based on a relative position between the plurality of convex layers.

The film deposition apparatus of the present invention can evaluate spotting precision based on a relative position between the plurality of convex layers, and thus the spotting precision of the droplet material can be precisely evaluated. Therefore, film deposition can be made with high precision.

In the above film deposition apparatus, the spotting precision test layer can be formed to have the property of repelling the droplet material.

BRIEF DESCRIPTION OF THE DRAWINGS

The invention will be described with reference to the accompanying drawings, wherein like numerals reference like elements, and wherein:

FIGS. 3(A) to (D) are partial sectional views schematically sowing the steps for producing the color filter shown in FIGS. 1 and 2;

FIGS. 4(A) to (D) are partial sectional views schematically sowing the steps for producing the color filter shown in FIGS. 1 and 2;

FIGS. 8(A) to (D) are partial sectional views schematically sowing the steps for producing the color filter shown in FIGS. 6 and 7;

FIGS. 9(A) to (D) are partial sectional views schematically sowing the steps for producing the color filter shown in FIGS. 6 and 7;

FIGS. 17(A) to (C) are partial sectional views schematically sowing the steps for producing the light emission substrate shown in FIG. 16;

FIG. 19 is a perspective view showing a digital still camera as an example of an electronic apparatus according to a sixth embodiment of the present invention;

FIGS. 20(A) to (C) are drawings showing examples of electronic apparatuses according to the sixth embodiment of the present invention, in which FIG. 20(A) shows a cellular phone, FIG. 20(B) shows a wristwatch, and 20(C) shows a portable information apparatus.

DETAILED DESCRIPTION OF PREFERRED EMBODIMENTS

Figure 1:
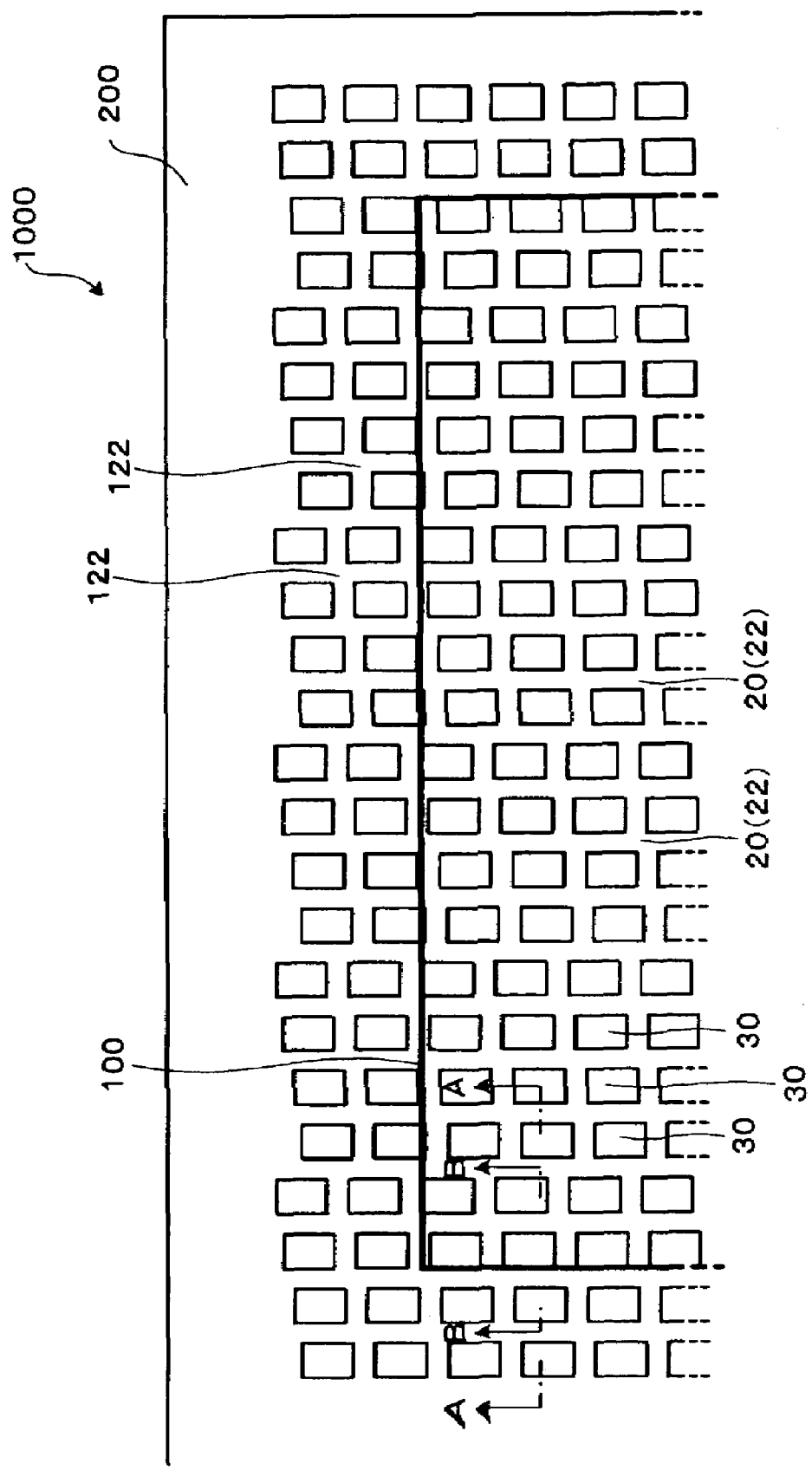
FIG. 1 is a partial plan view schematically showing a color filter according to a first embodiment of the present invention.
Figure 2:
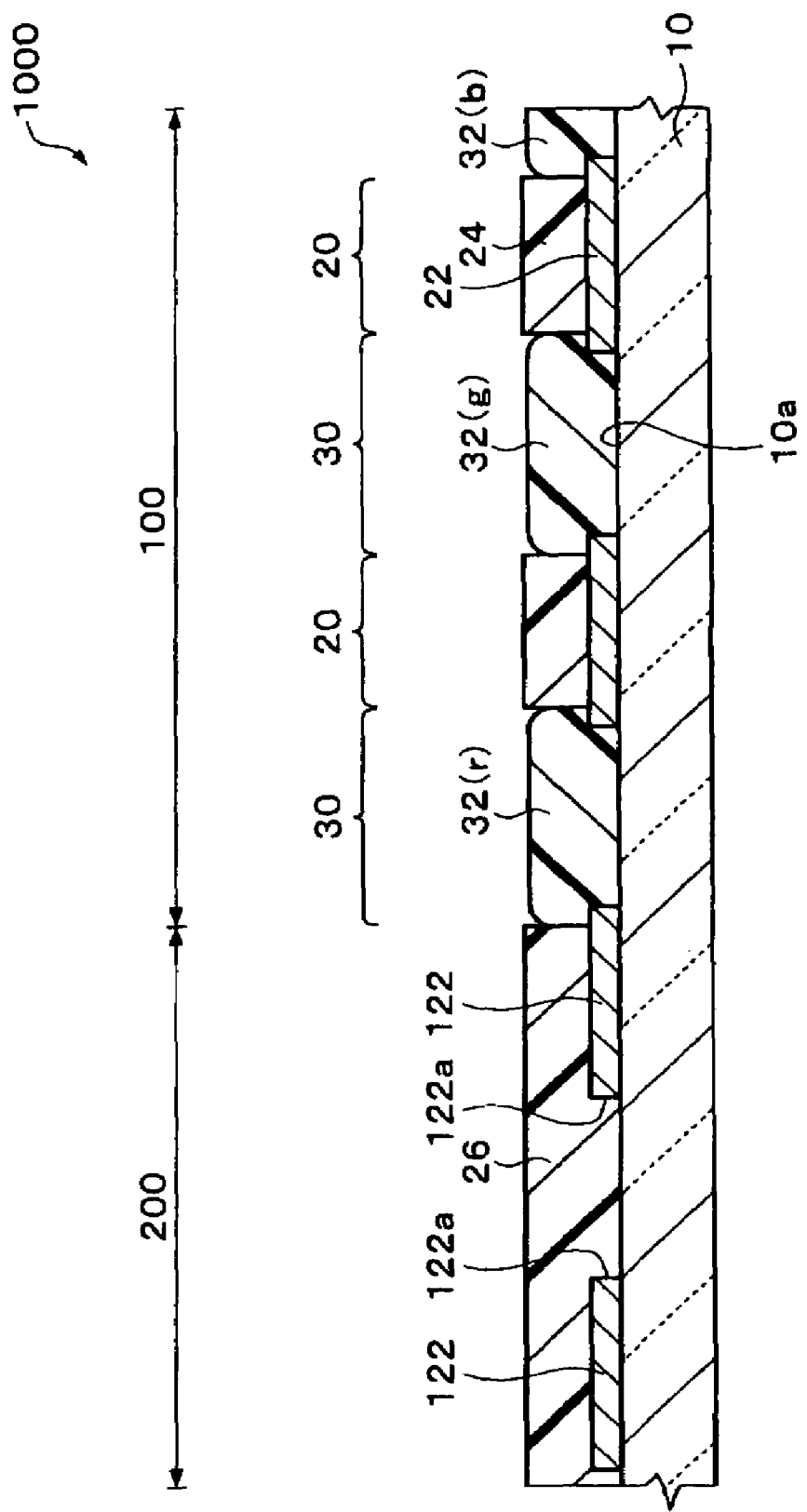
FIG. 2 is a partial sectional view schematically showing a portion shown in FIG. 1, taken along line A—A in FIG. 1.

FIG. 1 is a partial plan view schematically showing a color filter according to a first embodiment of the present invention, and FIG. 2 is a partial sectional view schematically showing a portion taken along line A—A in FIG. 1.

A color filter 1000 of this embodiment can include a transparent substrate 10, and a pixel region 100 and a peripheral region formed on the substrate 10. The peripheral region represents a region disposed adjacent to the pixel region 100 and including a light shielding region. The peripheral region includes a spotting precision test region 200. Namely, the spotting precision test region 200 is positioned apart from the pixel region 100. Although, in this embodiment, the spotting precision test region 200 is formed in the outer periphery of the pixel region 100, the position of the spotting precision test region 200 is not limited to this position.

As shown in FIGS. 1 and 2, the pixel region 100 includes a light shielding region 20 and a transmitting region 30 partitioned by the light shielding region 20. The light shielding region 20 is a region which substantially does not transmit light (visible light), and the transmitting region 30 is a region which can transmit light. As shown in FIG. 1, the light shielding region 20 and the transmitting region 30 are arrayed in a predetermined matrix pattern in the pixel region 100.

The light shielding region 20 can include a first light shielding layer 22 and a bank layer 24 formed on the first light shielding layer 22. The transmitting region 30 can include a color element 32. The color element 32 is formed on, for example, the substrate 10.

First, the light shielding region 20 is described.

The first light shielding layer 22 constituting the light shielding region 20 is formed in the predetermined matrix pattern on the substrate 10. The first light shielding layer 22 has sufficient light shielding performance. The material for the first light shielding layer 22 is not limited, and a metal, a resin, and the like can be used as long as it functions as a black matrix. As the material for the first light shielding layer 22, a metal is preferred because sufficient and uniform light shielding performance can be obtained by a thin layer. It should be understood that the metal used for the first light shielding layer 22 is not limited, and it can be selected in consideration of the efficiency of all steps comprising deposition and photo-etching. As such a metal, for example, chromium, nickel, aluminum, etc., which are used for the process of processing an electronic device, are preferably used. When the first light shielding layer 22 is made of a metal, with a thickness of 0.1 μm or more, the sufficient light shielding performance can be obtained. In consideration of the adhesion and brittleness of the metal layer, the thickness is more preferably 0.5 μm or less.

The bank layer 24 is formed on the first light shielding layer 22 and has the predetermined matrix pattern. The bank layer 24 partitions a region into parts in each of which a color element is formed, and prevents mixing (color mixing) of the colors of adjacent parts of the color element. Therefore, the thickness of the bank layer 24 is set based on the relationship with the height of a droplet material layer as a coloring material so as to prevent the droplet material from overflowing. From this viewpoint, the bank layer 24 is preferably formed in a thickness, for example, in the range of 1 to 5 μm.

The bank layer 24 comprises a resin layer which can be processed by photolithography. Such a photosensitive resin does not necessarily have a large angle of contact with water and excellent water-repellency or light shielding performance, and be selected from a wide range. As the resin for forming the bank layer 24, for example, photosensitive resin compositions containing a urethane resin, an acryl resin, a novolac resin, a cardo resin, a polyimide resin, polyhydroxystyrene, polyvinyl alcohol, or the like can be used.

Next, the transmitting region 30 is described. The transmitting region 30 is a region partitioned by the light shielding region 20. The transmitting region 30 comprises the color element 32.

The color elements 32 can include a plurality of color elements 32r, 32g and 32b having the primary colors red, green and blue, respectively. The color elements 32 are arranged in, for example, a stripe pattern, a delta pattern, or a mosaic pattern, the continuous three color elements forming one pixel. Each of the color elements 32 comprises a colored layer containing, for example, a pigment or dye.

The spotting precision test region 200 is included in the peripheral region. Since the spotting precision test region 200 is included in the peripheral region and surrounded by a light shielding layer (a second light shielding layer 122) of the peripheral region, the spotting precision test region 200 includes a region having a shape corresponding to the shape of the transmitting region 30. In the peripheral region, the region surrounded by the light shielding region is formed in an array. Specifically, as shown in FIG. 2, the spotting precision test region 200 comprises the second light shielding layer 122 (light shielding region) and a spotting precision test layer 26.

The second light shielding layer 122 constituting the spotting precision test region 200 is formed in a predetermined matrix pattern on the substrate 10. The second light shielding layer 122 can be formed in the same pattern as the first light shielding layer 22 constituting the pixel region 100. In this embodiment, the second light shielding layer 122 and the first light shielding layer 22 have the same pattern, and are formed in the same step. Namely, like the first light shielding layer 22, the second light shielding layer 122 has sufficiently light shielding performance, and the material for the second light shielding layer 122 is not limited. As the material, a metal, a resin, etc. can be used as long as the second light shielding layer 122 functions as a black matrix.

The spotting precision test layer 26 is provided in the peripheral region so as to cover the region surrounded by the light shielding region (the second light shielding layer 122) of the peripheral region, and has the property of repelling the droplet material. The spotting precision test layer 26 is provided in the spotting precision test region 200 so as to cover at least the second light shielding layer 122. In the color filter 1000 of this embodiment, the spotting precision test layer 26 is formed on the substrate 10 so as to cover the second light shielding layer 122.

The spotting precision test layer 26 is used for measuring the spotting precision of the droplet material by spotting the droplet material on the surface of the layer 26. The spotting precision test region 200 comprises a region (evaluation region) partitioned by the second light shielding layer 122. In this embodiment, the region partitioned by the first light shielding layer 22 and the region partitioned by the second light shielding layer 122 have the same pattern.

In order to securely measure the spotting precision of the droplet material, the surface of the spotting precision test layer 26 must have water-repellency to the droplet material. The term "water repellency to the droplet material" can mean low wettability with the droplet material. In order to impart water repellency to the droplet material to the surface of the spotting precision test layer 26, the spotting precision teat layer 26 is formed by using a material having water repellency to the droplet material, or the surface of the spotting precision test layer 26 is treated to impart water repellency to the droplet material, for example, by fluorination by plasma treatment, or the like. In this embodiment, the spotting precision test layer 26 can be formed by using the same material as the bank layer 24 constituting the pixel region 10.

The spotting precision test layer 26 is not necessarily formed over the entire region of the spotting precision test region 200, it may be formed at least in a region of the spotting precision test region 200, in which the spotting test of the droplet material is performed, namely, a region in which the droplet material is spotted.

Figure 5:
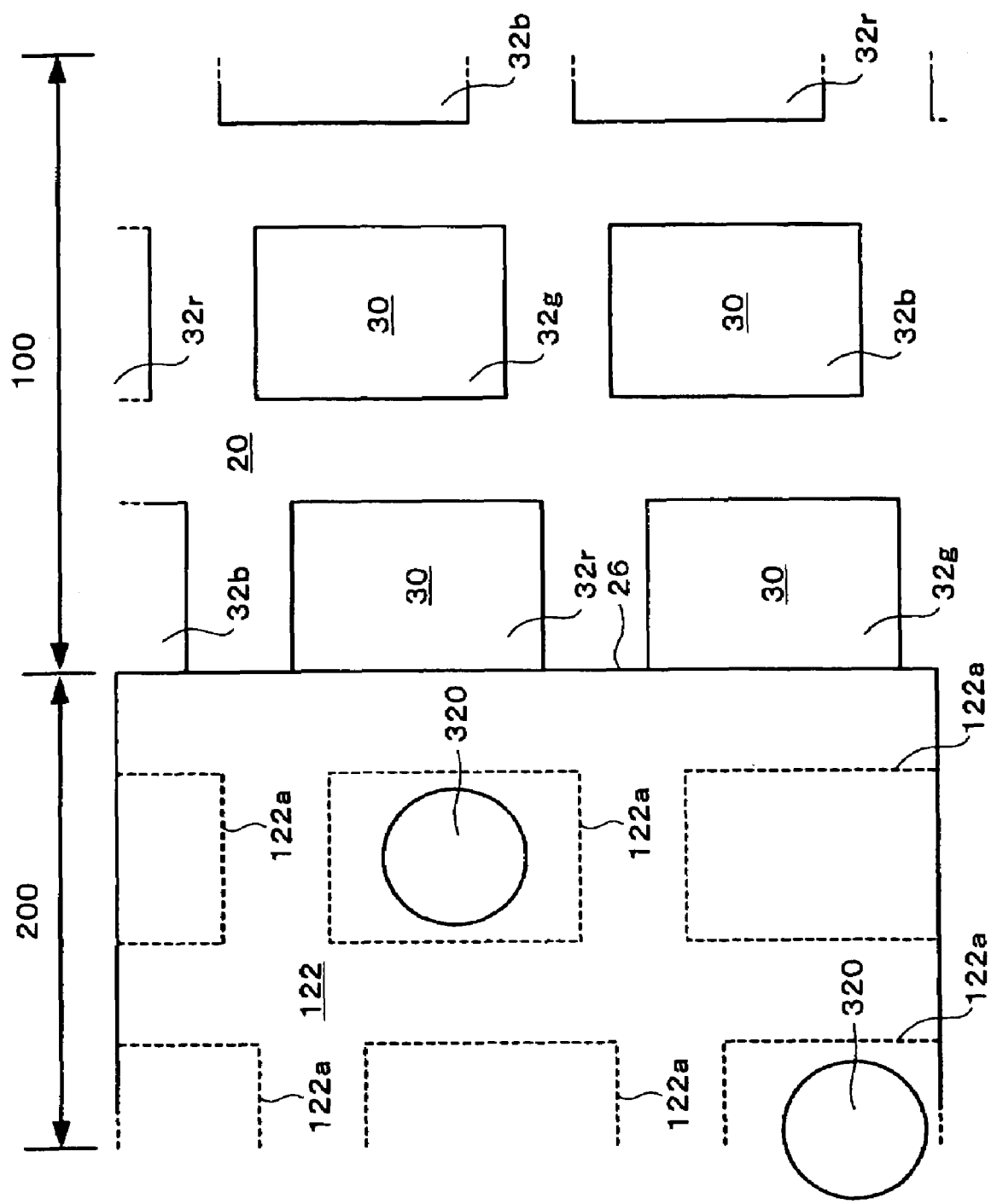
FIG. 5 is an enlarged partial plan view of the vicinity of line A—A in FIG. 1, schematically showing the color filter obtained by the steps shown in FIGS. 3 and 4.

The method of producing the color filter of this embodiment is described with reference to FIGS. 3 to 5. FIGS. 3 and 4 are sectional views schematically showing the layer structures in the respective steps, taken along line B—B in FIG. 1. FIG. 5 is an enlarged partial plan view of the vicinity of line A—A in FIG. 1, schematically showing the color filter obtained the steps shown in FIGS. 3 and 4.

As shown in FIG. 3(A), a metal layer 220 is deposited to a thickness of 0.1 to 0.5 μm on the pixel region 100 and the spotting precision test region 200 of the transparent substrate 10 by a dry plating method, for example, a sputtering method, a vapor deposition method, or a chemical vapor deposition method. As described above, any of various metals such as chromium, nickel, aluminum, and the like can be used as a material for the metal layer 220. Then, a resist layer R1 having a predetermined pattern is formed on the surface of the metal layer 220 by photolithography. The photolithography process is performed for the pixel region 100 and the spotting precision test region 200 by using the same mask pattern. Then, the metal layer 220 is patterned by etching using the resist layer R1 as a mask. In this way, as shown in FIG. 3(B), the first and second light shielding layers 22 and 122 having the predetermined matrix pattern are respectively formed on the pixel region 100 and the spotting precision test region 200 of the substrate 10. The first and second light shielding layers 22 and 122 have the same pattern.

Next, as shown in FIG. 3(C), a resin layer 240 is formed on the first and second light shielding layers 22 and 122 respectively formed in the pixel region 100 and the spotting precision test region 200 of the substrate 10. The resin layer can be formed by using a negative or positive resist. The resin layer 240 is made of, for example, an urethane or acrylic photo-curing (negative) photosensitive resin. Then, the resin layer 240 is patterned by exposure and development using a photo-mask M1. As a result, as shown in FIG. 3(D), the bank layer 24 is formed in the pixel region 100 to form the light shielding region 20, and the spotting precision test layer 26 is formed in the spotting precision test region 200. The structures of the bank layer 24 and the spotting precision test layer 26 have been described above, and thus a description thereof is omitted. In this step, a color element formation region 330 partitioned by the light shielding region 20 is formed in a predetermined matrix pattern in the pixel region 100.

Next, according to demand, the exposed surface of the substrate 10 is treated before the subsequent step of forming the color element. The surface can be treated by a method such as ultraviolet irradiation, plasma irradiation, laser irradiation, and the like. In this surface treatment, contaminants adhering to the exposed surface 10a of the substrate 10 can be removed to decrease the angle of contact between the surface 10a and water, improving wettability with the droplet material. Specifically, a difference between the angle of contact between the exposed surface 10a of the substrate 10 and water and the angle of contact between the surface of the bank layer 24 and water is preferably 15° or more. In this way, by controlling the angle of contact between the exposed surface 10a of the substrate 10 and water and the angle of contact between the surface of the bank layer 24 and water, the droplet material can be applied to the exposed surface 10 of the color element formation region 330 with good adhesion, and an overflow of the droplet material beyond the bank layer 24 can be prevented by the droplet material-repelling property of the bank layer 24. Also, the occurrence of nonuniformity in the thickness due to pulling of the droplet material by the bank layer is suppressed in the course of drying of the droplet material.

As the surface treatment method, an inline plasma irradiation-system surface treatment method is preferably used because it is suitable for forming a line process.

Next, the droplet material used for forming the color elements 32 is spotted on the spotting precision test layer 26 in the spotting precision test region 200 to measure spotting precision of the droplet material before the color element 32 is formed in the pixel region 100.

In this embodiment, as the method of applying the droplet material, a droplet material discharge method using a droplet material discharge head is used. In order to precisely spotting the droplet material in the fine color element formation region 330, for example, of a 50-μm square, the droplet material discharge method capable of making the fine droplets discharged, and controlling the number of the droplets discharged is optimum.

When the droplet material is applied by the droplet material discharge method, the droplet material is not spotted at an estimated position due to the following causes. The conceivable causes are that the droplet material discharge head is disposed obliquely, that the nozzle used for discharging the droplet material is inclined, that the droplet material is discharged obliquely from the nozzle, and that the relative position between the substrate and the droplet material discharge head is deviated. By evaluating the spotting precision of the droplet material by the method below, these causes can be cleared for improving the spotting precision of the droplet material.

First, as shown in FIG. 4(A), the droplet material is applied to the spotting precision test layer 26 in the spotting precision test region 200 to form a convex droplet material layer 320. The convex layer 320 is formed on the portion of the spotting precision test layer 26, which is not positioned above the second light shielding layer 122. Namely, the convex layer 320 is spotted in the region of the spotting precision test layer 26, which is surrounded by the edge 122a of the second light shielding layer 122 (refer to FIG. 5). As shown in FIG. 5, the spotting precision is evaluated by the relative position between the convex layer 320 and the edge 122a of the second light shielding layer 122 and/or the relative position between a plurality of the spotted convex layers 320. When the spotting precision is evaluated by the relative position of a plurality of the convex layers 320, as shown in FIG. 5, a plurality of the convex layers 320 are formed on the spotting precision test layer 26, and the spotting precision is evaluated by the relative position between the plurality of the convex layers 320.

In this embodiment, the first and second light shielding layers 22 and 122 respectively formed in the pixel region 100 and the spotting precision test region 200 have the same pattern. Namely, the regions respectively partitioned by the first and second light shielding layers 22 and 122 have the same pattern. Specifically, as shown in FIG. 4(A), the first and second light shielding layers 22 and 122 are formed so that the width $h_a$ (the width of the color element formation region 330) between the adjacent regions of the first light shielding layer 22 is substantially the same as the width $h_b$ between the adjacent regions of the second light shielding layer 122. Therefore, when the convex layer 320 is spotted on the region of the spotting precision test layer 26, which is surrounded by the edge 122a of the second light shielding layer 122, the spotting precision of the droplet material can be evaluated on the assumption that the droplet material is spotted on the color element formation region 330 of the pixel region 100.

When the result of the spotting precision of the droplet material is bad, adjustment is performed for improving the spotting precision according to demand.

Then, the color element 32 for actually forming pixels is formed. First, as shown in FIG. 4(B), a droplet material layer is formed in the pixel region 100 by applying the droplet material to the color element formation region 330 partitioned by the first light shielding layer 22 and the bank layer 24 to form the color element 32 (32g, 32r, 32b). In this embodiment, as the method of applying the droplet material, the droplet discharge method used for the above-described droplet material spotting precision test is used.

In order to precisely apply fine droplets to target positions (the exposed surface 10a of the substrate 10), the droplet size is first controlled to the size of the exposed surface 10a of the color element formation region 330 as a target. The droplet size is preferably controlled to 6 to 30 pico-liters, for example, for a 50 μm-square color element formation region 330. In consideration of throughput, the droplet size is more preferably 12 to 20 pico-liters. In order to discharge the droplets from the droplet material discharge head and precisely apply the droplets to the target, conditions are preferably controlled to prevent breakage of the droplets during flying, and to cause the droplets to fly straight.

In the present invention, in order to obtain the droplet material layer having a uniform thickness after adhesion, drying and curing, the following technique is preferably performed for improving leveling property in the course of drying.

One means is a method of adding a high-boiling-point solvent to the droplet material to decrease the drying speed. As the high-boiling-point solvent, at least one can be selected from butylcarbitol acetate, methoxybutyl acetate, ethoxyethyl propionate, and methoxy-2-propyl acetate. In consideration of dispersibility of a pigment or solubility of a dye, the solvent can be selected from a wide range solvents having a boiling point of 150 to 300° C.

Another technique is a method of controlling the drying speed of the applied droplet material. After the droplet material is applied, evaporation of a low-boiling-point solvent proceeds to increase the viscosity under leveling, and the resin component containing a pigment of dye is thermally cured by crosslinking. As a drying condition, at least either setting in a natural atmosphere or pre-baking at 40 to 100° C. can be combined with final baking at 150 to 300° C. according to the properties of the droplet material. The droplet material has specific viscosity, surface tension, and fluidity. Therefore, in order to obtain a uniform thickness after drying, the range and combination of the drying condition are selected according to the specific properties of the droplet material. When the dry curing condition does not match with the properties of the droplet material, the thickness of the color element is easily made nonuniform to cause irregularity in the pixel color tone.

In this embodiment, the color element 32 is formed for each of the red, green and blue colors. The formation order the colors of the color element is not limited. For example, the green color element 32g is first formed, and then either of the red color element 32r and the blue color element 32g is formed. Finally, the remaining color element is formed.

The color element can be formed for the red, green and blue colors at the same time by selecting a droplet material discharge-system color head or a plurality of heads.

As shown in FIG. 4(C), after the color element 32 is formed, an overcoat layer 40 is formed for obtaining a smooth surface. Furthermore, as shown in FIG. 4(D), a common electrode 50 is formed on the overcoat layer 40 to obtain the color filter 1000 according to demand. The overcoat layer 40 and the common electrode 50 can be provided according to the construction of an electrooptic device to which the color filter is applied.

The main operation and effect of the color filer of this embodiment are described below.

(a) In the color filter of this embodiment, the spotting precision of the droplet material is evaluated by spotting the convex droplet material layer 320 on the spotting precision test layer 26 in the spotting precision test region 200, and then the droplet material layer 320 is spotted on the color element formation region 330 to form the color element 32 actually used as the pixels in the pixel region 100. Therefore, the color element 32 can be precisely applied to the predetermined region.

Particularly, in the color filter of this embodiment, the region (evaluation region) partitioned by the second light shielding layer 122 is provided in the spotting precision test region 200. In this construction, when the droplet material layer 320 is spotted (refer to FIG. 4(A)), the spotting precision of the droplet material can be precisely measured. As a result, the color element 32 can be precisely formed to exhibit sufficient light shielding performance in the light shielding region 20 and no color mixing in the transmitting region 30. Therefore, a pixel defect and irregularity in color tone do not occur, and the contrast is high.

(b) By proving the first light shielding layer 22 and the bank layer 24, the light shielding function and the color element dividing function can be independently set, and thus both functions can be securely exhibited. As a result, the color filter of this embodiment causes less pixel defect due to insufficient light shielding performance and color mixing. Furthermore, dividing the functions permits optimum materials for forming the first light shielding layer 22 and the bank layer 24 to be selected from a wide range, and is advantageous from the viewpoint of production cost. Particularly, when the first light shielding layer 22 comprises a metal layer, the uniform and sufficient light shielding performance can be obtained by a thin layer.

The method of producing the color filter of this embodiment mainly has the following operations and effects.

(a) In the method of producing the color filter of this embodiment, the spotting precision of the droplet material is evaluated by spotting the convex droplet material layer (convex layer) 320 on the spotting precision test layer 26 in the spotting precision test region 200, and then the droplet material is spotted on the color element formation region 330 to form the color element 32 actually used as the pixels in the pixel region 100. Namely, the spotting precision of the droplet material can be evaluated by a simple method, and the color elements 32 are formed in the pixel region 1001 after the apparatus is controlled to improve the spotting precision of the droplet material based on the evaluation result according to demand. Therefore, the color element 32 can be precisely applied to the desired region. As a result, the light shielding region 20 has sufficient light shielding performance, and the transmitting region 30 has no color mixing. Therefore, the color filter having neither pixel defect nor irregularity in color tone, and high contrast can be formed.

(b) By using the droplet material discharge method for forming the color element 32, the number of the patterning steps using photolithography can be decreased to simply the process. Therefore, the color filter of this embodiment can be formed by a small number of steps. Furthermore, since the droplet material is deposited by the droplet material discharge method to form the color element 32, the droplet material can be applied to only the necessary color element formation region. Thus, unlike photolithography patterning, the coloring material is not lost by removing an unnecessary portion, thereby decreasing the cost of the color filter.

Figure 6:
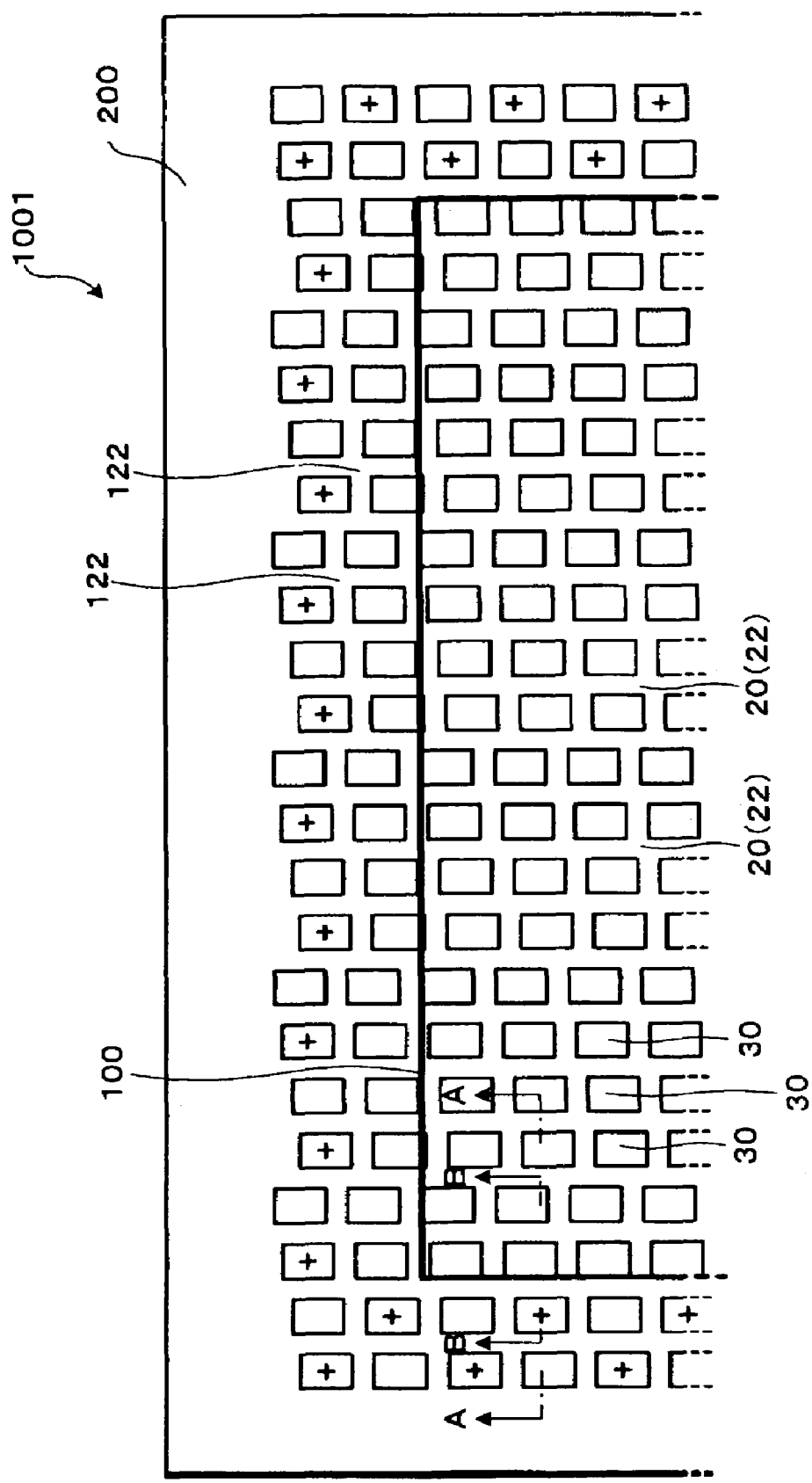
FIG. 6 is a partial plan view schematically showing a color filter according to a second embodiment.
Figure 7:
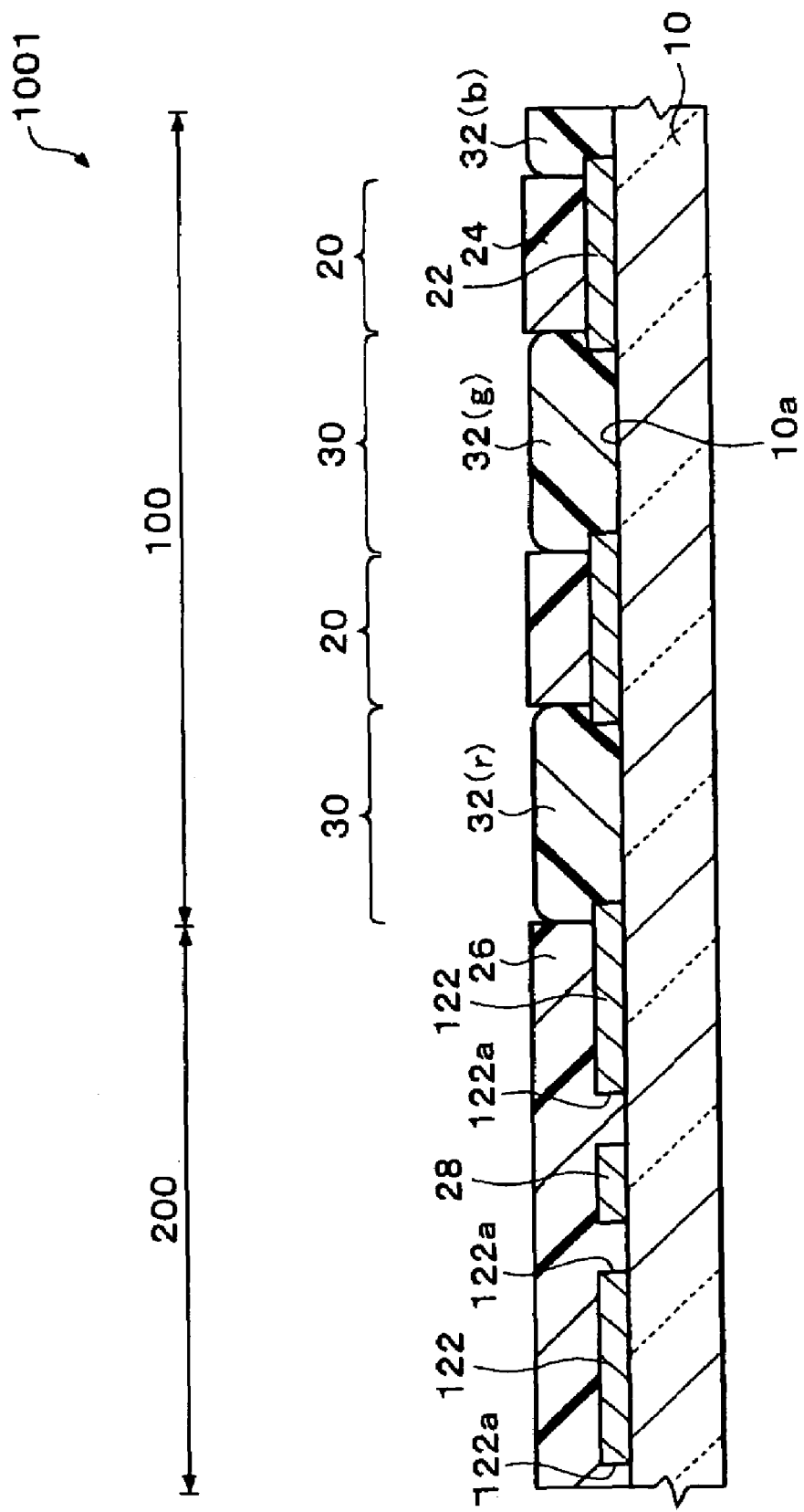
FIG. 7 is a partial sectional view schematically showing a portion shown in FIG. 6, taken along line A—A in FIG. 6.

FIG. 6 is a partial plan view schematically showing a color filter according to a second embodiment of the present invention, and FIG. 7 is a partial sectional view schematically showing a portion taken along line A—A in FIG. 6.

A color filter 1001 of this embodiment has a structure similar to the color filter 1000 shown in FIGS. 1 to 5 except that a vernier layer 28 is formed on a spotting precision test region 200 of a substrate 10. In the color filer 1001, portions having substantially the same functions as those of the color filter 1000 of the first embodiment are denoted by the same reference numerals, and a description thereof is omitted.

As shown in FIGS. 6 and 7, the vernier layer 28 is formed in the region (evaluation region) partitioned by the second light shielding layer 122 in the spotting precision test region 200. Although FIG. 6 shows the vernier layer 28 having a crucial planar shape, the planar shape of the vernier layer 28 is not limited to this, and various forms such as a circle, a triangle, a rectangle, and the like can be used. Furthermore, the spotting precision test layer 26 is formed on the vernier layer 28.

It should be understood that the material of the vernier layer 28, etc. are not limited as long as it can be discriminated from the convex layer 320 side when the spotting precision test layer 26 and the convex layer 320 are formed on the vernier layer 28, and a metal, a resin, and the like can be used. When the vernier layer 28 is formed in the same step as the first and second light shielding layers 22 and 122, the vernier layer 28 is formed by using the same material as the first and second light shielding layers 22 and 122.

Figure 10:
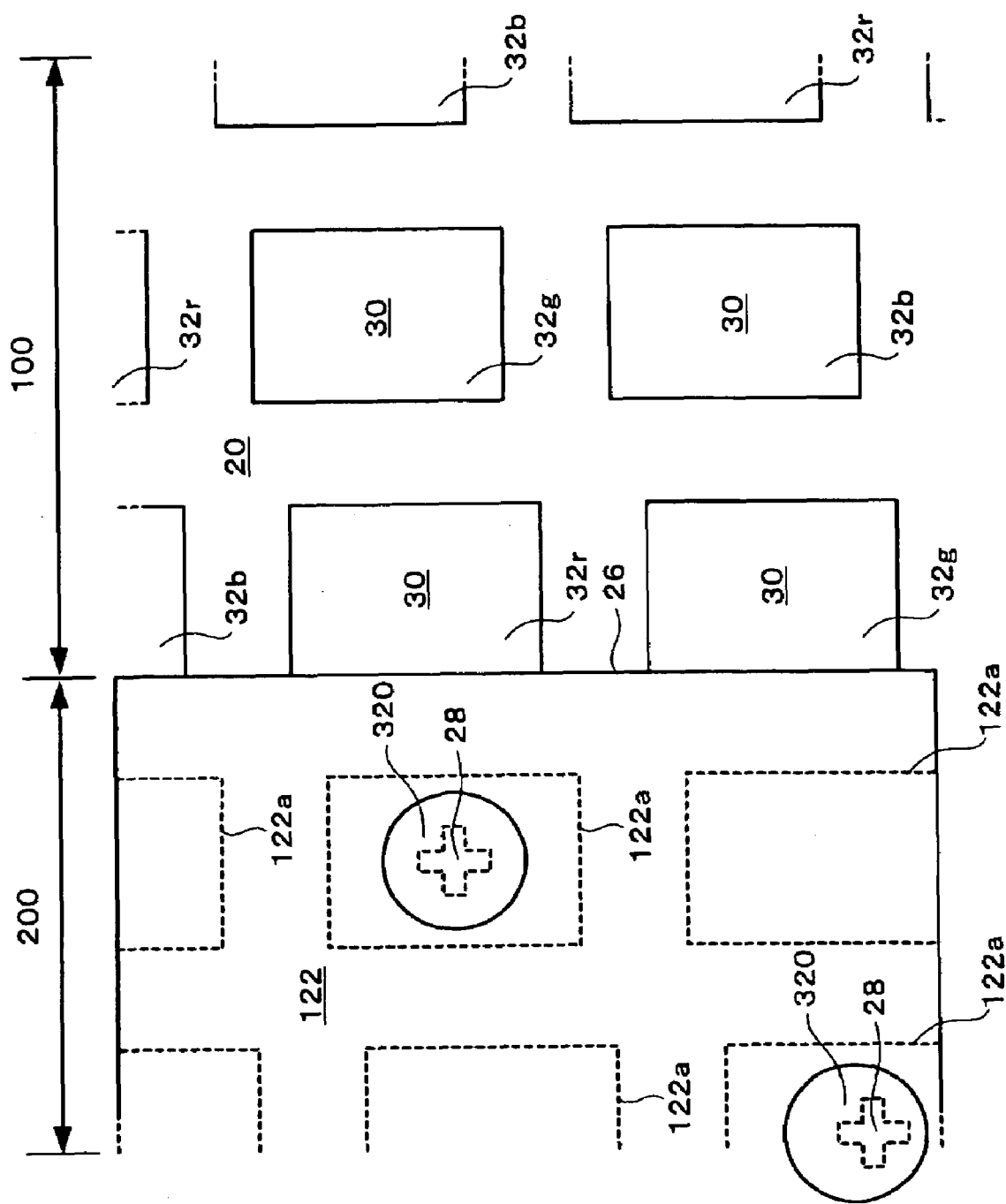
FIG. 10 is an enlarged partial plan view of the vicinity of line A—A in FIG. 6, schematically showing the color filter obtained by the steps shown in FIGS. 8 and 9.

The method of producing the color filter 1001 of this embodiment is described with reference to FIGS. 8 to 10. FIGS. 8 and 9 are sectional views schematically showing the layer structures in the respective steps, taken along line B—B in FIG. 6. FIG. 10 is an enlarged partial plan view of the vicinity of line A—A in FIG. 6, schematically showing the color filter obtained the steps shown in FIGS. 8 and 9. In each of the production steps, substantially the same portions as the method of producing the color filter 1000 of the first embodiment are not described in detail.

In this embodiment, the first and second light shielding layers 22 and 122, and the vernier layer 28 are first formed in the same step. As shown in FIG. 8(A), a metal layer 220 is deposited on the pixel region 100 and the spotting precision test region 200 of the transparent substrate 10 by. Then, a resist layer R2 having a predetermined pattern is formed on the surface of the metal layer 220 by photolithography. Next, the metal layer 220 is patterned by etching using the resist layer R2 as a mask. In this way, as shown in FIG. 8(B), the first light shielding layer 22 having the predetermined matrix pattern is formed on the pixel region 100 of the substrate 10, and the second light shielding layer 122 and the vernier layer 28 are formed in the spotting precision test region 200 of the substrate 10. In this step, the vernier layer 28 is formed in the region (evaluation region) partitioned by the second light shielding layer 122.

The steps described below are the same as the steps for producing the color filter of the first embodiment. Namely, as shown in FIG. 8(C), a resin layer 240 is formed on the first and second light shielding layers 22 and 122 respectively formed in the pixel region 100 and the spotting precision test region 200 of the substrate 10. Then, the resin layer 240 is patterned by exposure and development using a photo-mask M1. As a result, as shown in FIG. 8(D), the bank layer 24 is formed in the pixel region 100 to form the light shielding region 20, and the spotting precision test layer 26 is formed in the spotting precision test region 200. In this step, the color element formation region 330 partitioned by the light shielding region 20 is formed in a predetermined matrix pattern. Next, according to demand, the surface of the substrate 10 is treated before the subsequent step of forming the color element.

Next, the droplet material used for forming the color element 32 is spotted on the spotting precision test layer 26 in the spotting precision test region 200 to measure spotting precision of the droplet material before the color element 32 is formed in the pixel region 100. In this embodiment, like in the first embodiment, the color element 32 is formed by using the droplet material discharge method. Namely, in this embodiment, the spotting precision of the droplet material is measured in the spotting precision test region 200 by the same method as the first embodiment.

First, as shown in FIG. 9(A), the droplet material is applied to the spotting precision test layer 26 in the spotting precision test region 200 to form a convex droplet material layer 320. As described above, the spotting precision of the droplet material is evaluated by the relative position between the convex layer 320 and the edge 122a (refer to FIG. 10) of the second light shielding layer 122 and the relative position between a plurality of the spotted convex layers 320. In the color filter 1001 of this embodiment, the vernier layer 28 is formed on the substrate 10, and thus a deviation of the spot position of the droplet material can be precisely determined by the relative position between the convex layer 320 and the vernier layer 28, as shown in FIG. 5.

When the result of the spotting precision of the droplet material is bad, adjustment is performed for improving the spotting precision according to demand, and then the color filter 1001 is produced by the same production steps as the color filter of the first embodiment, as shown in FIGS. 9(B) to 9(D).

Beside the operations and effects of the color filter of the first embodiment, the color filter 1001 of this embodiment is capable of precisely determining a deviation of the spot position of the droplet material by the relative position between the convex layer 320 and the vernier layer 28 because the vernier layer 28 is formed on the substrate 10.

Figure 11:
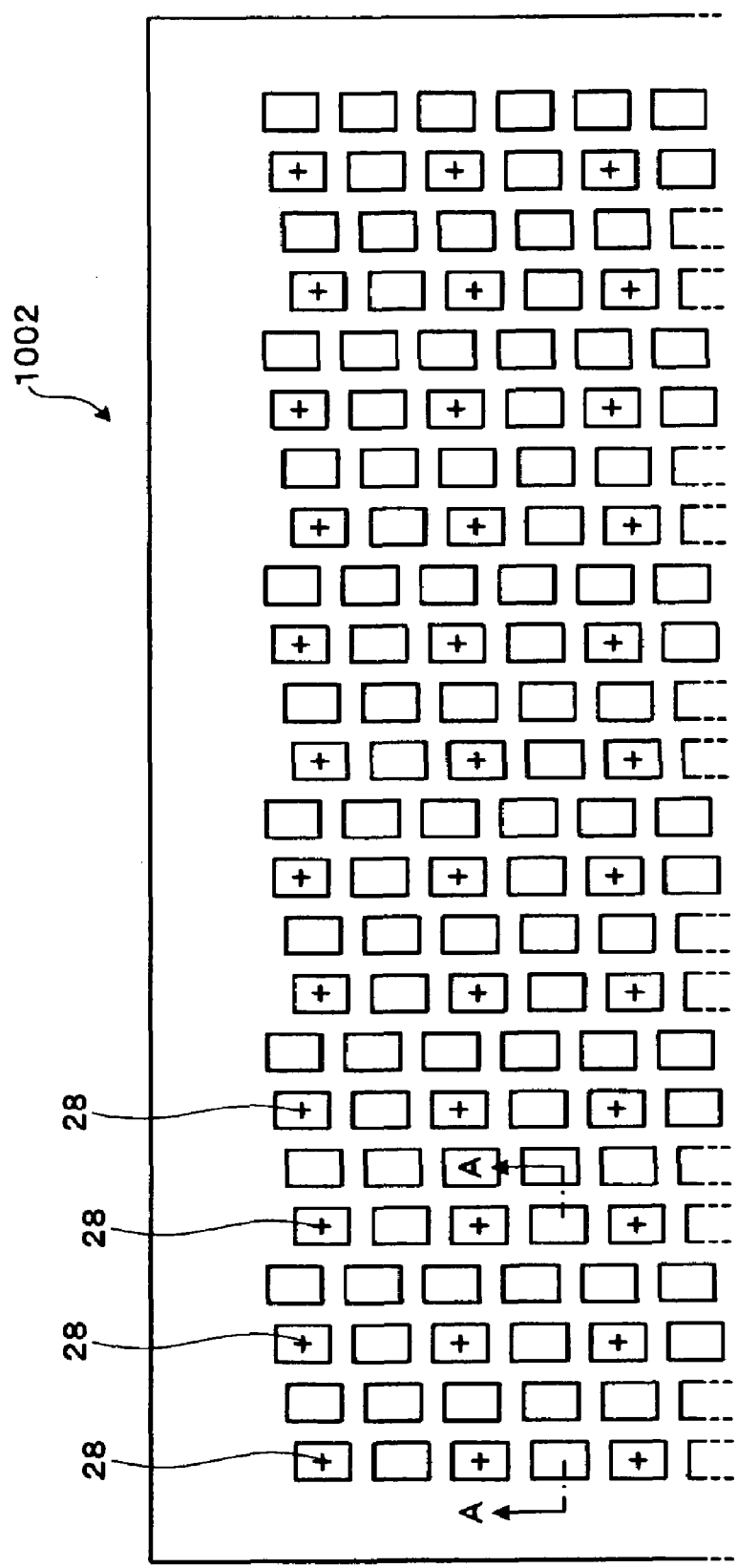
FIG. 11 is a partial plan view schematically showing a droplet material spotting precision test substrate for a color filter according to a third embodiment.
Figure 12:
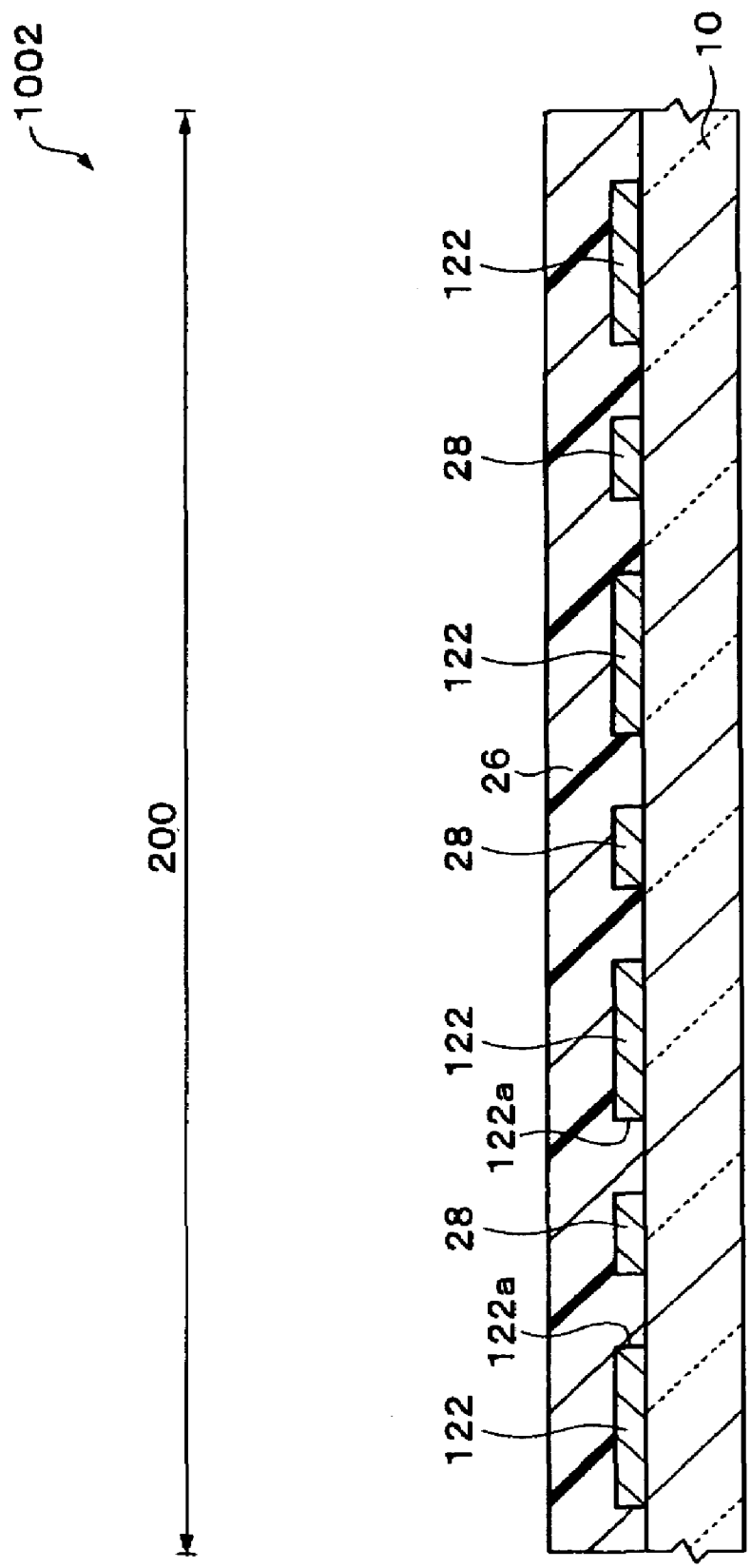
FIG. 12 is a partial sectional view schematically showing a portion shown in FIG. 11, taken along line A—A in FIG. 11.

FIG. 11 is a partial plan view schematically showing a droplet material spotting precision test substrate for a color filter according to a third embodiment of the present invention, and FIG. 12 is a sectional view schematically showing a portion taken along line A—A in FIG. 11.

A droplet material spotting precision test substrate 1002 for a color filter of this embodiment has a structure similar to the spotting precision test region 200 constituting the color filter 1001 of the second embodiment. Namely, the droplet material spotting precision test substrate 1002 does not have the pixel region 100 shown in FIG. 6, but has the spotting precision test region 200 shown in FIG. 6, which is formed over the entire surface. In the droplet material spotting precision test substrate 1002 for a color filer, portions having substantially the same functions as those of the color filter 1001 of the second embodiment are denoted by the same reference numerals, and a description thereof is omitted.

The droplet material spotting precision test substrate 1002 for the color filter includes the spotting precision test region 200. The spotting precision test region 200 includes the light shielding layer 122, and the spotting precision test layer 26 formed to cover the light shielding layer 122. The droplet material spotting precision test substrate 1002 is formed for a spotting precision test of the droplet material. Like in the spotting precision test region 200 of the color filer 1000 of the first embodiment (refer to FIG. 2), the spotting precision test region 200 provided in the spotting precision test substrate 1002 can include the region (evaluation region) partitioned by the light shielding layer 122. In the process for producing the color filter, the spotting precision test for the droplet material for forming the color element is carried out by using the droplet material spotting precision test substrate 1002 before the color filter is actually produced.

The droplet material spotting precision test substrate 1002 has the same structure as the color filter to be actually produced except the pixel region is not formed. Namely, the droplet material spotting precision test substrate 1002 is formed by using the same substrate as the color filter actually produced, and has the light shielding layer 122 having the same pattern as the light shielding layer formed in the color filter actually produced. Furthermore, the vernier layer 28 is formed in the region surrounded by the light shielding layer 122 on the substrate 10, and the spotting precision test layer 26 is formed on the substrate 10.

The droplet material spotting precision test substrate 1002 for the color filter is produced by the same as the process for producing the spotting precision test region 200 in the color filter 1001 of the second embodiment. In this embodiment, the spotting precision test of the droplet material can be carried out by the same steps as the second embodiment shown in FIG. 9. In this case, the spotting precision test of the droplet material is performed for the droplet material spotting precision test substrate 1002 before the color filter is actually produced.

Figure 13:
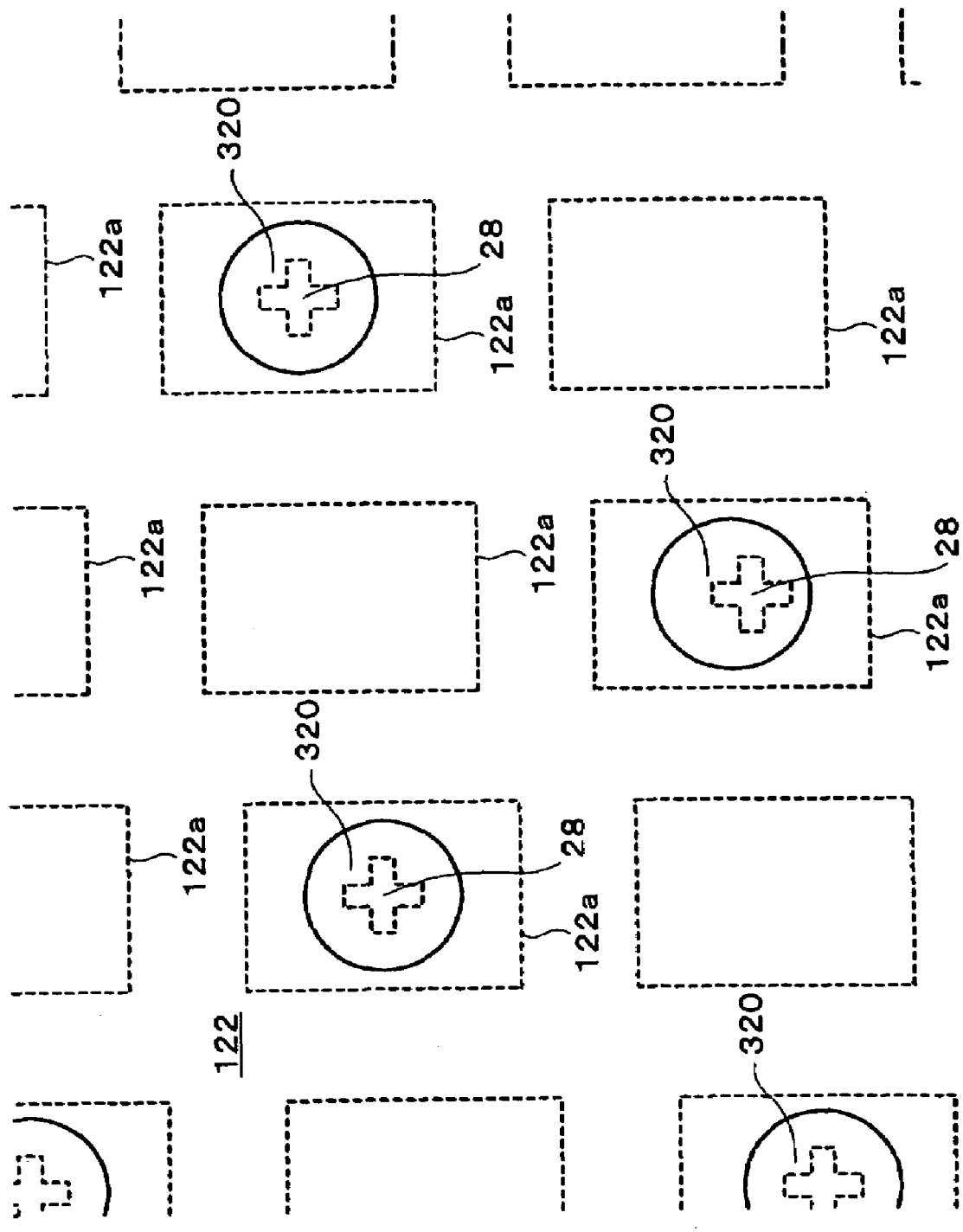
FIG. 13 is an enlarged partial plan view of the vicinity of line A—A in FIG. 11, schematically showing the color filter obtained by the steps for producing the droplet material spotting precision test substrate for the color filter according to the third embodiment.

FIG. 13 is an enlarged partial plan view of the vicinity of line A—A in FIG. 11, schematically showing the droplet material spotting precision test substrate 1002 after the droplet material spotting precision test.

Since the droplet material spotting precision test substrate 1002 has the same structure as the color filter actually produced, the spotting precision test can be carried out in the same manner as the test for the color filter actually produced. Furthermore, in this embodiment, the spotting precision test is performed for the droplet material spotting precision test substrate 1002 exclusively used as a test substrate before the color filter is produced. The second light shielding layer 122 having the same pattern and the color filter actually produced is formed in the droplet material spotting precision test substrate 1002. Therefore, the spotting precision of the droplet material is sufficiently confirmed by a pre-test for the droplet material spotting precision test substrate 1002, and then the color element can be formed in the color filter actually produced after the spotting precision is improved. Thus, the color filter having neither pixel defect nor irregularity in color tone, and high contrast can be produced.

Figure 14:
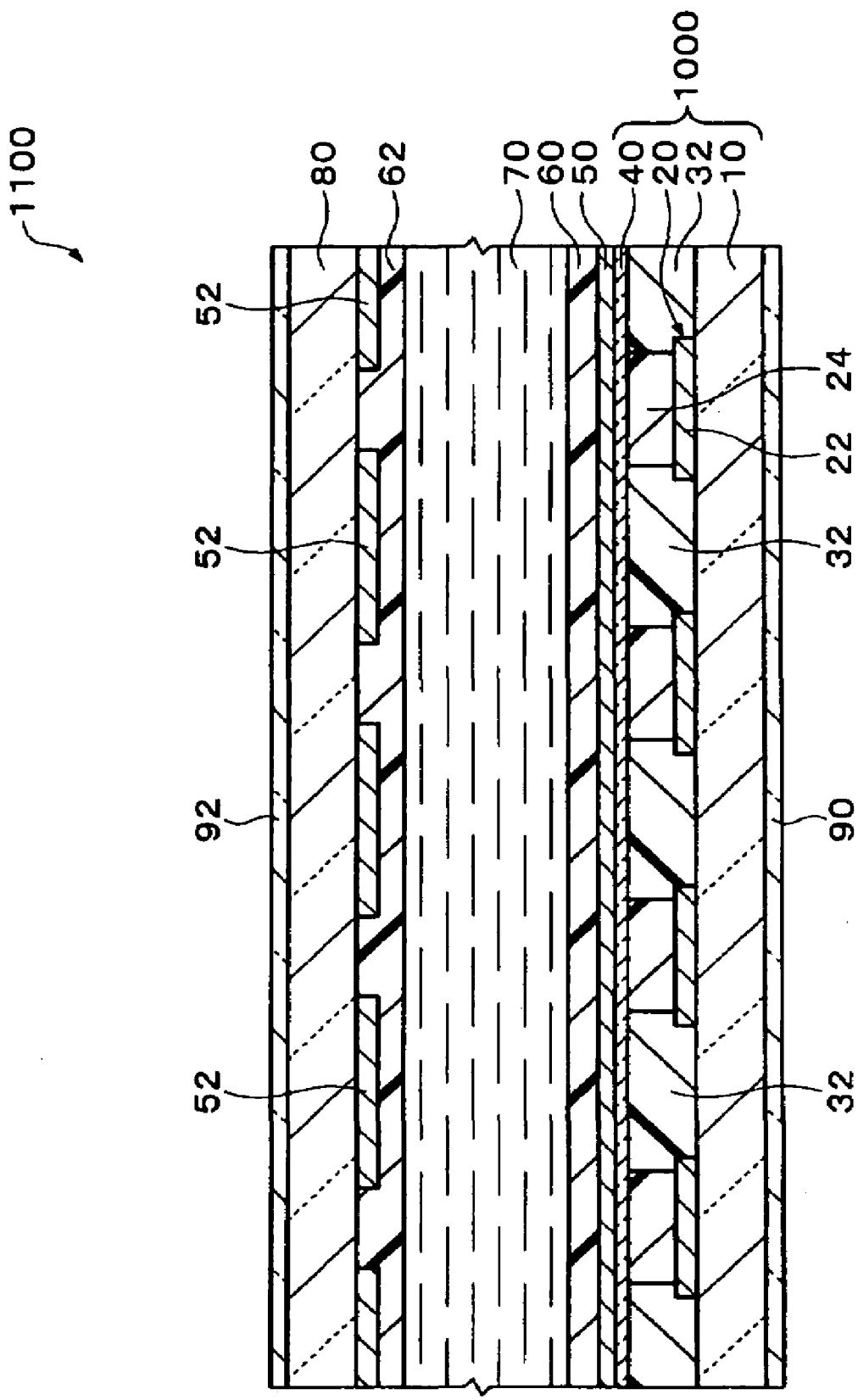
FIG. 14 is a sectional view schematically showing a liquid crystal display device as an example of an electrooptic device according to a fourth embodiment of the present invention.

FIG. 14 is a sectional view showing a color liquid crystal display device as an example of an electrooptic device into which the color filter 1000 of the first embodiment is incorporated. FIG. 14 shows only the pixel region 100 of the color filter 1000.

The color liquid crystal display device 1100 generally includes the color filter 1000 and a counter substrate 80, which are combined together, a liquid crystal composition 70 being sealed between both members. In the liquid crystal display device 1100, TFT (thin film transistor) elements (not shown) and pixel electrodes 52, which are formed in a matrix on the inner surface of the substrate 80. The color filter 1000 is provided as the other substrate so that the color element 32 having red, green and blue colors is arranged corresponding to the pixel electrodes 52. Furthermore, alignment films 60 and 62 are respectively formed on the opposed surfaces of the substrate 80 and the color filter 1000. The alignment films 60 and 62 are rubbed to orient the liquid crystal molecules in a predetermined direction. Also, polarizing plates 90 and 92 are respectively bonded to the outer surfaces of the substrate 80 and the color filer 1000. As a back light, a combination of a fluorescent lamp (not shown) and a scattering plate is generally used so that the liquid crystal composition is caused to function as an optical shutter for changing transmittance of the back light to achieve a display.

Although, in the this embodiment, the example in which the color filter 1000 of the first embodiment is incorporated into the liquid crystal display device is described, a liquid crystal display device may be formed by incorporating the color filter 1001 of the second embodiment in place of the color filter 1000.

Figure 15:
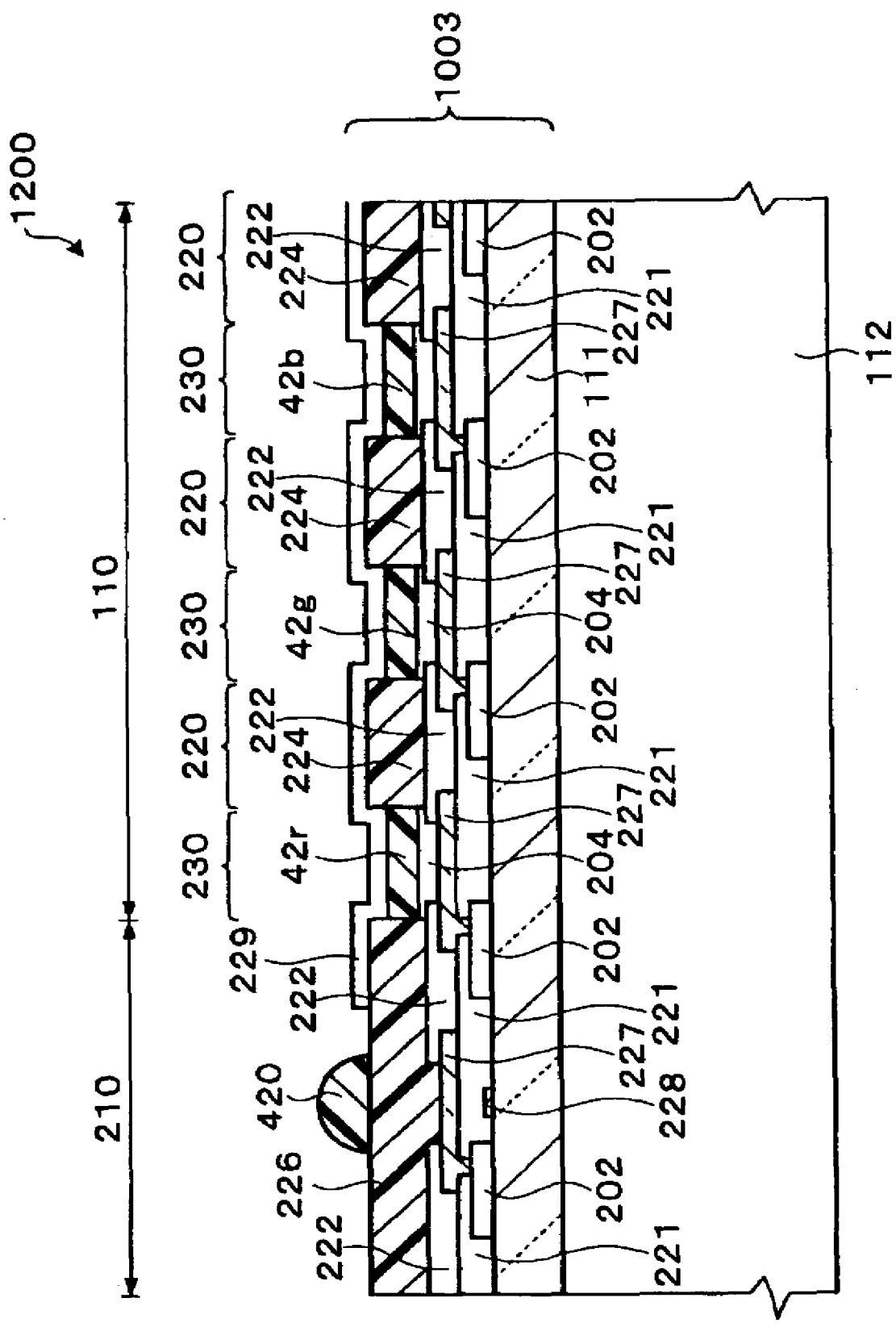
FIG. 15 is a sectional view schematically showing an EL display device as an example of an electrooptic device according to a fifth embodiment of the present invention.
Figure 16:
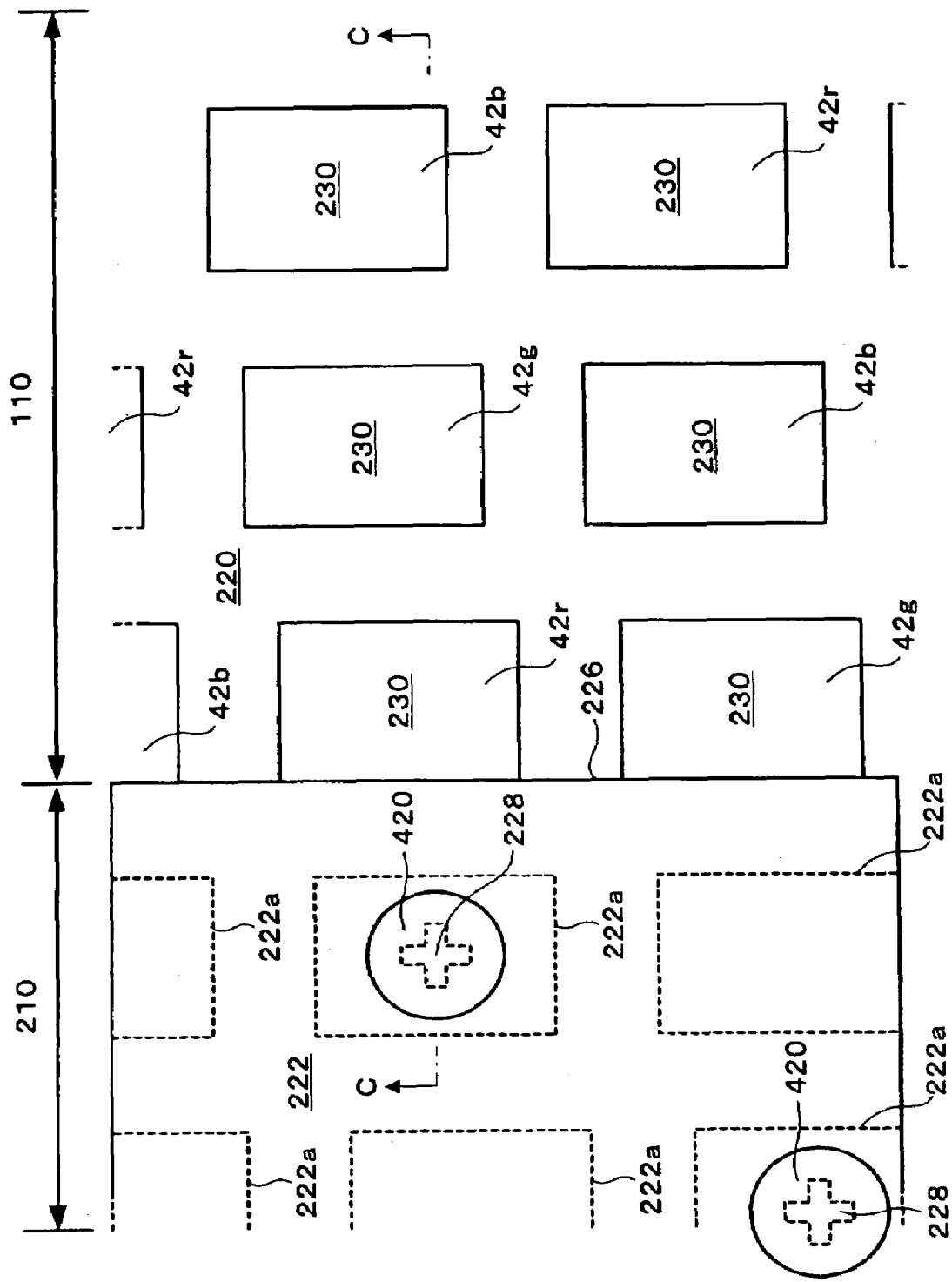
FIG. 16 is a sectional view schematically showing the light emission substrate shown in FIG. 15.

FIG. 15 is a sectional view showing a light emission substrate 1003 and a color EL display device 1200 as an example of an electrooptic device into which the light emission substrate 1003 is incorporated. FIG. 16 is a plan view schematically showing the light emission substrate 1003 shown in FIG. 15. In this embodiment, a description is made of an example in which the light emission substrate 1003 is a color light emission substrate. The light emission substrate 1003 has the same structure as the color filter 1000 of the first embodiment, and portions having the same functions and effects as the color filter 1000 are denoted by the same reference numerals. These portions are not described below.

As shown in FIG. 15, the color EL display device 1200 comprises a base 112, and the light emission substrate 1003 provided in the base 112.

The light emission substrate is 1003 outlined below. As shown in FIGS. 15 and 16, the light emission substrate 1003 includes a pixel region 110 and a peripheral region. The peripheral region means a region arranged adjacent to the pixel region 110. The peripheral region includes a spotting precision test region 210. Namely, the spotting precision test region 210 is positioned apart from the pixel region 110. The spotting precision test region 210 is included in the peripheral region, and includes an evaluation region having a shape corresponding to the shape of a light emission region 230. First, the pixel region 110 is described.

As shown in FIGS. 15 and 16, the pixel region 110 includes a bank region (partition region) 220, and the light emission region 230. The bank region 220 and the light emission region 230 are formed on a base 111. The light emission region 230 is partitioned by the bank region 220. Specifically, as shown in FIG. 16, the light emission region 230 is partitioned by the bank region 220 in the pixel region 110.

The pixel region 110 further comprises switching elements 202 formed on the base 111.

The base 111 functions as a support and a plane for emitting light. Therefore, the base 111 is selected in consideration of light transmission properties and thermal stability. Examples of transparent substrate materials for the base 111 include glass, transparent plastics, and the like.

As the switching elements 202, for example, TFT elements can be used. The adjacent switching elements 202 are separated by an insulating layer 221.

The light emission region 230 includes a function layer and a pair of electrodes comprising first and second electrode layers 227 and 229. The function layer includes a luminescent layer, and if required, a hole transport/injection layer. In the light emission substrate 1003 of this embodiment, the functional layer includes luminescent layers 42 (42g, 42r, 42b) and a hole transport/injection layer 204.

The luminescent layers 42 are arranged in a predetermined matrix pattern and partitioned by the bank region 220. As shown in FIG. 15, the luminescent layers 42 are formed between the first electrode 227 and the second electrode layer 229. In this embodiment, the luminescent layers 42 can include a plurality of luminescent layers 42r, 42g and 42b respectively having the light primary colors, red, green and blue. These luminescent layers 42 are arranged in a predetermined pattern, for example, a stripe pattern, a delta pattern, or a mosaic pattern, the continuous three color elements forming one pixel. In this embodiment, the luminescent layers 42 are formed by using a material which can emits light by electroluminescence.

In the light emission substrate 1003 of this embodiment, as shown in FIG. 15, the hole transport/injection layer 204 can be formed between the first electrode 227 and the luminescent layers 42. The "hole transport/injection layer" means a layer for transporting holes from an anode to the luminescent layers or effectively injecting the hole.

The bank region 220 is mainly formed for partitioning the luminescent layers 42. As the bank region 220, a laminate comprising a bank insulating layer (first insulating layer) 222 and a resin layer 224 can be used. The bank insulating layer 222 comprises, for example, a silicon oxide layer. The resin layer 224 comprises, for example, polyimide. The bank insulating layer 222 is laminated on the insulating layer 221, and the resin layer 224 is formed on the bank insulating layer 222. The bank insulating layer 222 serves as a component of the bank region 220 and has the function to partition the light emission region 230 and separate the adjacent portions of the first electrode layer 227.

The first and second electrode layers 227 and 229 are provided for applying an electric charge to the luminescent layers 42. In this embodiment, the case in which the first electrode layer 227 servers as an anode, and the second electrode layer 229 serves as a cathode is described. The first electrode layer 227 can be formed by using a metal with a high work function (for example, 4 eV or more), an alloy, an electrically conductive compound, or a mixture thereof. For example, the first electrode layer 227 comprises a transparent conductive material such as ITO, CuI, $SnO_2$, ZnO, or the like. The second electrode layer 229 can be formed by using an electron injection metal, an alloy, an electrically conductive compound, or a mixture thereof.

The spotting precision test region 210 is included in the peripheral region. Since the spotting precision test region 210 is included in the peripheral region, and has a region having a shape corresponding to the light emission region 230. The region having the shape corresponding to the shape of the light emission region 230 is arrayed. Specifically, as shown in FIG. 15, the spotting precision test region 210 can include a spotting precision test layer 226. In the spotting precision test region 210, like in the pixel region 110, the switching elements 202 formed on the base 111, the bank insulating layer (second insulating layer) 22 for separating the adjacent switching elements 202, the first electrode layer 227 mainly formed on the bank insulating layer 222 and connected to the switching elements 202, and the bank insulating layer 222 for separating the adjacent regions of the first electrode layer 227 are formed.

The spotting precision test layer 226 is provided in the peripheral region so as to cover the region having the shape corresponding to the shape of the light emission region 230, and has the property of repelling the droplet material. The spotting precision test layer 226 can be formed by using the same material as the resin layer 224 of the bank region 220 constituting the pixel region 110. For example, when the resin layer 224 is made of a polyimide resin, the spotting precision test layer 226 can also be made of a polyimide resin.

Also, the bank insulating layer (second insulating layer) 222 constituting the spotting precision test region 210 can be formed in the same step as the bank insulating layer (first insulating layer) 222 constituting the bank region 220 in the pixel region 110. Namely, the first bank insulating layer 222 constituting the spotting precision test region 210 can be formed to the same height from the substrate 112 as the second bank insulating layer 222 constituting the bank region 220 in the pixel region 110, and has the same pattern as the pixel region 110.

Furthermore, the switching elements 202 formed in the spotting precision test region 210 can be formed in the same step as the switching elements 210 formed in the pixel region 110, and have the same structure as in the pixel region 110.

In the light emission substrate 1003 of this embodiment, as shown in FIG. 15, a vernier layer 228 is formed on the base 111. The vernier layer 228 has the same function and effect as the vernier layer constituting the color filter of the second embodiment. In the light emission substrate 1003 of this embodiment, the vernier layer 228 is formed to the same height from the substrate 112 as a metal wiring layer (not shown) constituting the switching elements 202. In this case, the vernier layer 228 can be formed by using the same material as the metal wiring layer. For example, when the metal wiring layer is made of chromium or aluminum, the vernier layer 228 can also be made of chromium or aluminum.

Next, the operation and function of the color EL display device 1200 comprising the light emission substrate 1003 shown in FIG. 15 are described.

When a predetermined voltage is applied to the first electrode layer (anode) 227 and the second electrode layer (cathode) 229, electrons from the cathode 229 and holes from the anode 227 are injected into the luminescent layers 42. In the luminescent layers 24, the electrons and the holes are re-combined to produce excitons, and the excitons are inactivated to emit light such as fluorescent light and phosphorescent light.

Figure 18:
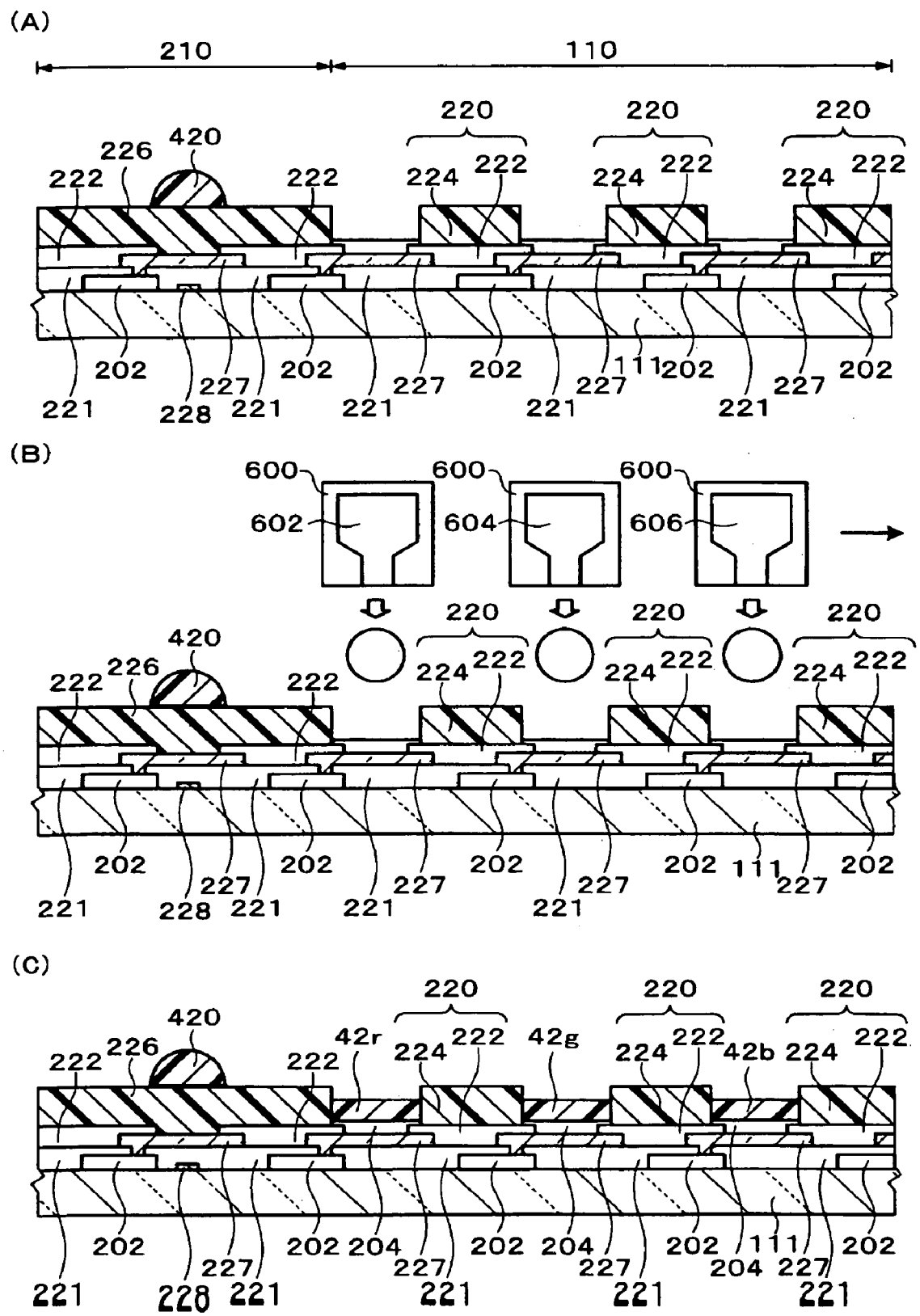
FIGS. 18(A) to (C) are partial sectional views schematically sowing the steps for producing the light emission substrate shown in FIG. 16.

The method of producing the light emission substrate 1003 of this embodiment is described with reference to FIGS. 17 and 18. FIGS. 17(A) to (C) and FIGS. 18(A) to (C) are sectional partial views schematically showing the respective steps for the light emission substrate 1003 shown in FIG. 16, taken along line C—C in FIG. 16.

As shown in FIG. 17(A), in the pixel region 110 and the spotting precision test region 210, the switching elements 202, the insulating layer 221 for separating the adjacent switching elements 202, the first electrode layer 227, and the bank insulating layer (first and second insulating layer) 222 having the predetermined pattern are formed in turn on the base 111 by a known method. As shown in FIG. 17(A), apertures are formed in predetermined regions (positioned above the switching elements 202) of the insulating layer 221 before the first electrode layer 227 is formed, and then the first electrode layer 227 is formed on the insulating layer 221 to electrically connect the switching elements 202 to the first electrode layer 227. As shown in FIG. 16, in the step described below, the light emission region 230 is formed in the portions where the bank insulating layer 222 is not formed.

Then, a photosensitive resin layer (not shown) is formed over the entire surface, and then patterned by photolithography to form the resin layer 224 on the bank insulating layer 222 in the pixel region 110, forming the bank region 220. At the same time, in the spotting precision test region 210, the bank insulating layer 222 and the spotting precision test layer 226 on the first electrode layer 227 are formed. By forming the bank region 220, apertures are formed in the region where the light emission region 230 is formed in the step described below. Namely, the apertures serve as a functional layer formation region 430. In other words, the functional layer formation region 430 is a region partitioned by the bank region 220, in which a functional layer (the luminescent layers 42 and the hole transport/injection layer 204) is formed in the step described below.

Then, as shown in FIGS. 17(B) and (C), the hole transport/injection layer 204 is formed in the functional layer formation region 430 by using the droplet material discharge method using a droplet material discharge head 500 which is used in the droplet material discharge system. As the material 502 for forming the hole transport/injection layer 204, for example, a mixture of polyethylene dioxythiophene and polystyrene sulfonate can be used. However, in this embodiment, the same hole transport/injection layer made of the same material is formed for color dots, a hole transport/injection material suitable for each of the luminescent layers may be used to form the hole transport/injection layer.

Next, the droplet material used for forming the luminescent layers 42 is spotted on the spotting precision test layer 226 in the spotting precision test region 210 to measure spotting precision of the droplet material before the luminescent layers 42 are formed in the pixel region 110.

In this embodiment, the luminescent layers 42 are formed by the same droplet material discharge method as that for forming the hole transport/injection layer 204.

When the droplet material is applied by the droplet material discharge method, as described above, the droplet material is not spotted at an estimated position due to the following causes. The conceivable causes are that the droplet material discharge head is disposed obliquely, that the nozzle used for discharging the droplet material is inclined, that the droplet material is discharged obliquely from the nozzle, and that the relative position between the substrate and the droplet material discharge head is deviated. By evaluating the spotting precision of the droplet material by the method below, these causes can be cleared for improving the spotting precision of the droplet material.

First, as shown in FIG. 18(A), the droplet material is applied to the spotting precision test layer 226 in the spotting precision test region 210 to form a convex droplet material layer 420. The convex layer 420 is formed on the portion of the spotting precision test layer 226, which is positioned above the bank shielding layer 222. Namely, the convex layer 320 is spotted in the region inside the edge the edge 222a of the bank shielding layer 222 (refer to FIG. 16). As shown in FIG. 16, the spotting precision is evaluated by the relative position between the convex layer 420 and the edge 222a of the bank shielding layer 222 and/or the relative position between a plurality of the spotted convex layers 420. When the spotting precision is evaluated by the relative position of a plurality of the convex layers 420, as shown in FIG. 16, a plurality of the convex layers 420 are formed on the spotting precision test layer 226, and the spotting precision is evaluated by the relative position between the plurality of the convex layers 420.

In this embodiment, the bank layer 222 has the same pattern in the pixel region 110 and the spotting precision test region 210. Namely, when the convex layer 420 is spotted on the region of the spotting precision test layer 226, which is surrounded by the edge 222a of the second bank layer 222, the spotting precision of the droplet material can be evaluated on the assumption that the droplet material is spotted on the functional layer formation regions 430 of the pixel region 110.

When the result of the spotting precision of the droplet material is bad, adjustment is performed for improving the spotting precision according to demand.

Then, the luminescent layers 42 (42g, 42r, 42b) for actually forming pixels are formed. First, as shown in FIG. 18(B), a droplet material layer for the red luminescent layer, a droplet material layer for the green luminescent layer and a droplet material layer for the blue luminescent layer are coated on the hole transport/injection layer 204 by the droplet material discharge method. Then, a solvent is removed, and heat treatment is performed in a nitrogen atmosphere to cure or conjugate the droplet material compositions. As a result, the red luminescent layer 42r, the green luminescent layer 42g and the blue luminescent layer 42b having the primary colors, red, green and blue, are formed, as shown in FIG. 18(C). The luminescent layers conjugated by heat treatment are insoluble in the solvent. The light emission region 230 shown in FIG. 15 is formed by the above-described steps.

By using the droplet material discharge method, a fine pattern can be simply formed within a short time. Also, the thickness can be changed by changing the sold concentration and the discharge amount of the droplet material.

The hole transport/injection layer 204 may be continuously treated with oxygen gas and fluorocarbon plasma before the luminescent layers 42 are formed. This can form a fluoride layer on the hole transport/injection layer 204 to increase ionization potential, thereby providing an organic EL substrate with excellent efficiency of hole injection.

Also, according to the type of the luminescent material used, one or two color organic luminescent layers can be formed by the droplet material discharge method, and the other two or one color layer can be formed by a conventional coating method. In this method, even when the luminescent material unsuitable for the droplet material discharge method is used, a full color organic EL substrate can be formed by combining with another organic luminescent material used for the droplet material discharge method, increasing the degree of freedom of element design. As the coating method other than the droplet material discharge method, a printing method, a transfer method, a dipping method, a spin coating method, a cast method, a capillary method, a roll coating method, a bar coating method, and the like can be used.

As shown in FIG. 15, a second electrode layer 229 is formed as a cathode. As the second electrode layer 229, a metal thin film can be used. As the metal used for forming the second electrode layer 229, for example, magnesium, silver, aluminum, lithium, or the like can be used. Besides these metals, other materials having a low work function can also be used. For example, an alkali metal, an alkali earth metal such as potassium or the like, and alloy containing any of theses metals can be used, and a metal fluoride can also be used. The second electrode layer 229 can be formed by vapor deposition or sputtering.

Furthermore, a protective film may be formed on the second electrode layer 229. By forming the protective film, deterioration, damage and separation of the second electrode layer 229 and the luminescent layers 42 can be prevented.

Examples of the material for forming the protective film include an epoxy resin, an acrylic resin, liquid glass, and the like. Examples of the method of forming the protective film include a spin coating method, a cast method, a dipping method, a bar coating method, a roll coating method, a capillary method, and the like.

The second electrode layer 229 can be provided according to the construction of an electrooptic device to which a light emitter is applied. Then, the light emission substrate 1003 is cut at predetermined positions to form a plurality of light emitters.

In the above-described production method, a known material can be used for each of the layers. Also, the materials disclosed in Japanese Patent Application Nos. 11-134320 and 11-250486 filed by the applicant can be used as the materials for the hole transport/injection layer, the luminescent layers, etc.

Although, in the above production method, the hole transport/injection layer and the luminescent layer, which constitute a color dot, are formed by the droplet material discharge method, only the luminescent layer may be formed, or an electron transport/injection layer may further be provided.

Like the droplet material spotting precision test substrate for the color filer of the third embodiment, a droplet material spotting precision test substrate not having the pixel region 110 of the light emission substrate 1003 of this embodiment can also be formed (refer to the seventh embodiment below). By using the droplet material spotting precision test substrate of the light emission substrate, the spotting precision test of the droplet material can be performed for the droplet material spotting precision test substrate comprising the first electrode layer 227 and the bank insulating layer 222 which respectively have the same patterns as the light emission substrate actually produced. Therefore, the luminescent layers of the light emission substrate actually produced can be formed after the spotting precision of the droplet material is sufficiently confirmed ad improved. As a result, the light emission substrate having a high contrast without a pixel defect and irregularity in color tone can be produced.

An example of an electronic apparatus using a liquid crystal display device as an electrooptic device of the present invention is described.

A description is made of a digital still camera using the liquid crystal display device 1100 of the fourth embodiment of the present invention as a finder. FIG. 19 is a perspective view showing the construction of the digital still camera, and briefly showing the connection with an external apparatus.

In a usual camera, a film is exposed to an optical image of a subject, while in a digital still camera 2000, an image signal is produced by photoelectric conversion of an optical image of a subject by an imaging device such as CCD (Charge Coupled Device) or the like. In the digital still camera 2000, the liquid crystal panel of the above-descried liquid crystal display device 1100 is provided on the back (the front side of FIG. 19) of a case 2202 so that a display is performed based on the image signal from the CCD. Therefore, the liquid crystal display device 1100 functions as the finder for displaying the subject. Also, a light receiving unit 2204 comprising an optical lens and the CCD is provided on the front side (the back side of FIG. 19) of the case 2202.

When a shutter button 2206 is pressed after the subject image displayed on the liquid crystal display device 1100 is confirmed by a photographer, the image signal of the CCD is transmitted to a memory of a circuit board 2208 and stored in the memory. In the digital still camera 2000, video signal output terminals 2212 and an input/output terminal 2214 for data communication are provided on the side of the case 2202. As shown in FIG. 19, according to demand, a television monitor 2300 is connected to the video signal output terminals 2212, and a personal computer 2400 is connected to the input/output terminal 2214 for data communication. Furthermore, the image signal stored in the memory of the circuit board 2208 is output to the television monitor 2300 and the personal computer 2400 by a predetermined operation.

FIGS. 20(A), (B) and (C) are drawings showing the appearances of other examples of electronic apparatuses each using a liquid crystal display device as the electrooptic device of the present invention. FIG. 20(A) shows a cellular phone 3000 comprising the liquid crystal display device 1100 provided on the front plane. FIG. 20(B) shows a wristwatch 4000 including the liquid crystal display device 1100 provided at the center of the front plane of the body. FIG. 20(C) shows a portable information apparatus 5000 including a display section comprising the liquid crystal display device 1100, and an input section 5100.

Although not shown in the drawings, besides the liquid crystal display device 1100, each of the electronic apparatuses can further include various circuits, such as a display information output source, a display information processing circuit, a clock generating circuit, etc., and a display signal generating section including a power supply circuit for supplying electric power to these circuits. For example, in the portable information apparatus 5000, the display signal produced by the display signal generating section is supplied the display section based on the information input from the input section 5100, forming a display image.

It should be understood that the electronic apparatus into which the liquid crystal display device 1100 of the present invention is incorporated is not limited to the digital still camera, the cellular phone, the wristwatch, and the portable information apparatus. Conceivable examples of electronic apparatuses include an electronic notebook, a pager, a POS terminal, an IC card, a minidisk player, a liquid crystal projector, a personal computer (PC) for multimedia and an engineering work station (EWS), a notebook-size personal computer, a work processor, a television, a view finder-type or monitor direct viewing-type video tape recorder, an electronic notebook, an electric table calculator, a car navigation device, a device comprising a touch panel, a watch, and the like.

From the viewpoint of the driving system, a simple matrix liquid crystal display panel and a static driving liquid crystal display panel, which do not use the switching elements, and an active matrix liquid crystal display panel using a three-terminal switching element such as a TFT (thin film transistor), or a tow-terminal switching element such as a TFD (thin film diode), can be used as the liquid crystal display panel. From the viewpoint of the electrooptic properties, various types of liquid crystal panels such as a TN type, a STN type, a guest-host type, a phase transition type, a ferroelectric type, and the like can be used.

Although the devices according to the present invention are described above with reference to the specified embodiments, various modifications can be made within the gist of the present invention. Although, in the above-described embodiments, a description is made of the case in which the liquid crystal display device 1100 of the fourth embodiment of the present invention is used as the image display means (the electrooptic display section) of the electrooptic device, the present invention is not limited to this. For example, the EL display device 1200 of the fifth embodiment of the present invention can also be used. In addition, the electrooptic device of the present invention can also be applied to various electrooptic means such as a small-size television using a thin cathode ray tube or a liquid crystal shutter, an electroluminescence plasma display, a CRT display, a FED (Field Emission Display) panel, an electrophoretic display device, and the like.

Figure 21:
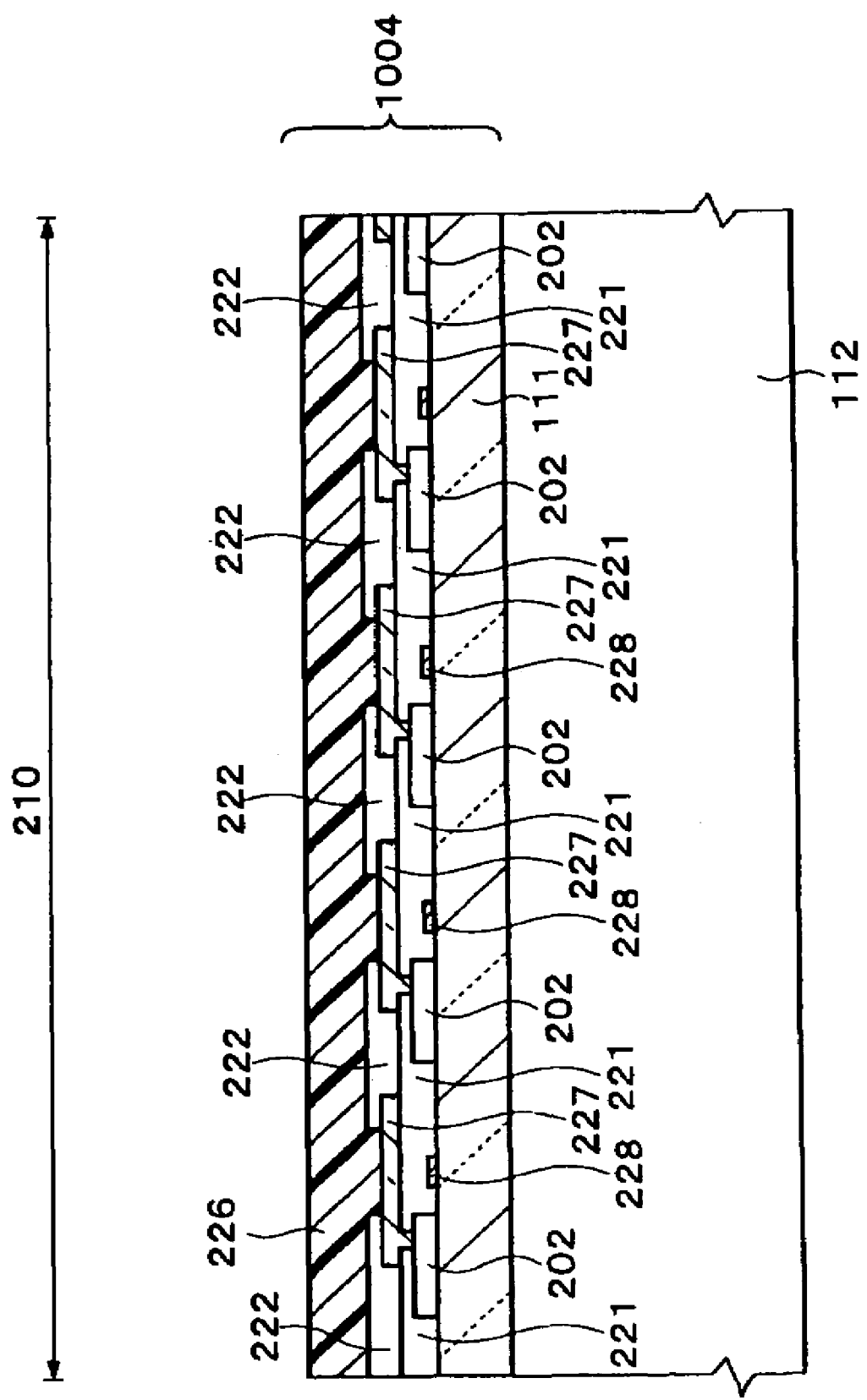
FIG. 21 is a partial plan view schematically showing a droplet material spotting precision test substrate for a light emission substrate according to a seventh embodiment of the present invention.

FIG. 21 is a partial plan view schematically showing a droplet material spotting precision test substrate 1004 for a light emission substrate according to the seventh embodiment.

The droplet material spotting precision test substrate 1004 for the liquid emission substrate of this embodiment has a structure similar to the spotting precision test region 210 (refer to FIG. 15) constituting the light emission substrate 1003 of the fifth embodiment. Namely, the droplet material spotting precision substrate 1004 shown in FIG. 21 does not comprise the pixel region 100 shown in FIG. 15, but includes the spotting precision test region 210 shown in FIG. 15, which is formed over the entire surface. In the droplet material spotting precision test substrate 1004 for the light emission substrate, the portions having substantially the same functions as the light emission substrate 1003 of the fifth embodiment are denoted by the same reference numerals, and are not described in detail below.

The droplet material spotting precision test substrate 1004 for the light emission substrate includes a switching element 202 formed on a base 111, an electrode 227, a bank insulating layer 222, and a spotting precision test layer 226. The electrode 227 is connected to the switching element 202, and the spotting test layer 226 is formed on the electrode 227. The bank insulating layer 222 has a predetermined pattern and has the function to separate the adjacent regions of the electrode 227.

The droplet material spotting precision test substrate 1004 is formed for the spotting precision test of the droplet material. Namely, in the process for producing the light emission substrate, the spotting precision test of the droplet material is carried out by using the droplet material spotting precision test substrate 1004 before the light emission substrate is actually produced.

The droplet material spotting precision test substrate 1004 has the same structure as the light emission substrate to be actually produced except the pixel region is not formed. Namely, the droplet material spotting precision test substrate 1004 is formed by using the same substrate as the light emission substrate actually produced. The bank insulating layer 226 and the electrode 227 respectively have the same patterns as the bank insulating layer 226 and the electrode 227 of the light emission substrate 1003 shown in FIG. 15, which is formed in the light emission substrate actually produced. Furthermore, a vernier layer 228 comprising a metal layer is formed on the base 111. Like in the light emission substrate 1003 shown in FIG. 15, the vernier layer 228 can be formed to the same height from the substrate 112 as a metal wiring layer (not shown) constituting the switching element 202.

The droplet material spotting precision test substrate 1004 for the light emission substrate can be produced by the same process as that for producing the spotting precision test region 210 in the light emission substrate 1003 of the fifth embodiment. In this embodiment, the spotting precision test of the droplet material can be carried out by the same step as the step shown in FIG. 18(A) in the fifth embodiment. In this case, the spotting precision test of the droplet material is performed for the droplet material spotting precision test substrate 1004 before the light emission substrate is actually produced.

Since the droplet material spotting precision test substrate 1004 has the same structure as the light emission substrate actually produced, the spotting precision test can be carried out in the same manner as the test for the light emission substrate actually produced. Furthermore, in this embodiment, the spotting precision test is performed for the droplet material spotting precision test substrate 1004 exclusively used as a test substrate before the light emission substrate is produced. As a result of the test, a convex layer (not shown in FIG. 21) is formed on the spotting precision test layer 226 like in the light emission substrate 1003 shown in FIG. 15.

Since the droplet material spotting precision test substrate 1004 includes the bank shielding layer 222 and the electrode layer 227, which are respectively formed in the same patterns as the light emission substrate actually produced, the spotting precision of the droplet material is sufficiently confirmed by a pre-test for the droplet material spotting precision test substrate 1004, and then the function layer can be formed in the light emission substrate actually produced after the spotting precision is improved. Thus, the light emission substrate having neither pixel defect nor irregularity in color tone, and high contrast can be produced.

What is claimed is:

1. A color filter, comprising:
   a pixel region having a light shielding region and a transmitting region surrounded by the light shielding region;
   a color element formed in the transmitting region by discharging a droplet material;
   a peripheral region arranged adjacent to the pixel region and having a light shielding region;
   an evaluation region included in the peripheral region and surrounded by the light shielding region of the peripheral region to have a shape corresponding to the shape of the transmitting region; and
   a layer provided in the peripheral region to cover the evaluation region and having the property of repelling the droplet material.

* * * * *